(12) United States Patent
Heo et al.

(10) Patent No.: US 11,088,126 B2
(45) Date of Patent: Aug. 10, 2021

(54) DISPLAY DEVICE AND METHOD OF MANUFACTURING THE SAME

(71) Applicant: Samsung Display Co., Ltd., Yongin-Si (KR)

(72) Inventors: Euikang Heo, Seoul (KR); Cha-dong Kim, Seoul (KR); Hyunae Kim, Seoul (KR); Chongsup Chang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/447,403

(22) Filed: Jun. 20, 2019

(65) Prior Publication Data

US 2020/0051962 A1 Feb. 13, 2020

(30) Foreign Application Priority Data

Aug. 7, 2018 (KR) ........................ 10-2018-0091721

(51) Int. Cl.
*H01L 51/00* (2006.01)
*H01L 25/16* (2006.01)
*H01L 27/12* (2006.01)

(52) U.S. Cl.
CPC ........ *H01L 25/167* (2013.01); *H01L 27/1288* (2013.01)

(58) Field of Classification Search
CPC . H01L 51/5206; H01L 51/5209; H01L 33/36; H01L 27/3262; H01L 27/3258; H01L 2251/558
See application file for complete search history.

(56) References Cited

U.S. PATENT DOCUMENTS

2018/0122837 A1 5/2018 Kang et al.

FOREIGN PATENT DOCUMENTS

| KR | 10-2017-0107619 A | 9/2017 |
| KR | 10-2018-0046491 A | 5/2018 |
| KR | 10-2020-0001648 A | 1/2020 |
| KR | 10-2020-0004936 A | 1/2020 |

OTHER PUBLICATIONS

Young-Hee Joo, Jong-Chang Woo, Kyung-Rok Choi, Han-Soo Kim, Jae-Hyung Wi, and Chang-Il Kim, "Dry Etching of ITO Thin Films by the Addition of Gases in Cl2/BCl3 Inductivity Coupled Plasma", Transactions on Electrical and Electronic Materials, vol. 13, No. 3, pp. 157-161, Jun. 25, 2012, 5 pages, pISSN: 1229-7607, eISSN: 2092-7592, School of Electrical and Electronics Engineering, Chung-Ang University, Seoul 156-756, Korea.

*Primary Examiner* — Robert G Bachner
(74) *Attorney, Agent, or Firm* — Lewis Roca Rothgerber Christie LLP

(57) ABSTRACT

A display device includes a pixel circuit, a first insulating layer covering the pixel circuit, a first electrode disposed on the first insulating layer, a second electrode disposed on the first insulating layer and spaced apart from the first electrode in a first direction, and a light emitting element electrically connected to the first electrode and the second electrode and disposed between the first electrode and the second electrode. A recess is provided in a first region of the first insulating layer between the first electrode and the second electrode when viewed in a plan view, and a width of the recess in the first direction is greater than a length of the light emitting element in the first direction. The first electrode and the second electrode do not overlap the recess when viewed in a plan view.

11 Claims, 23 Drawing Sheets

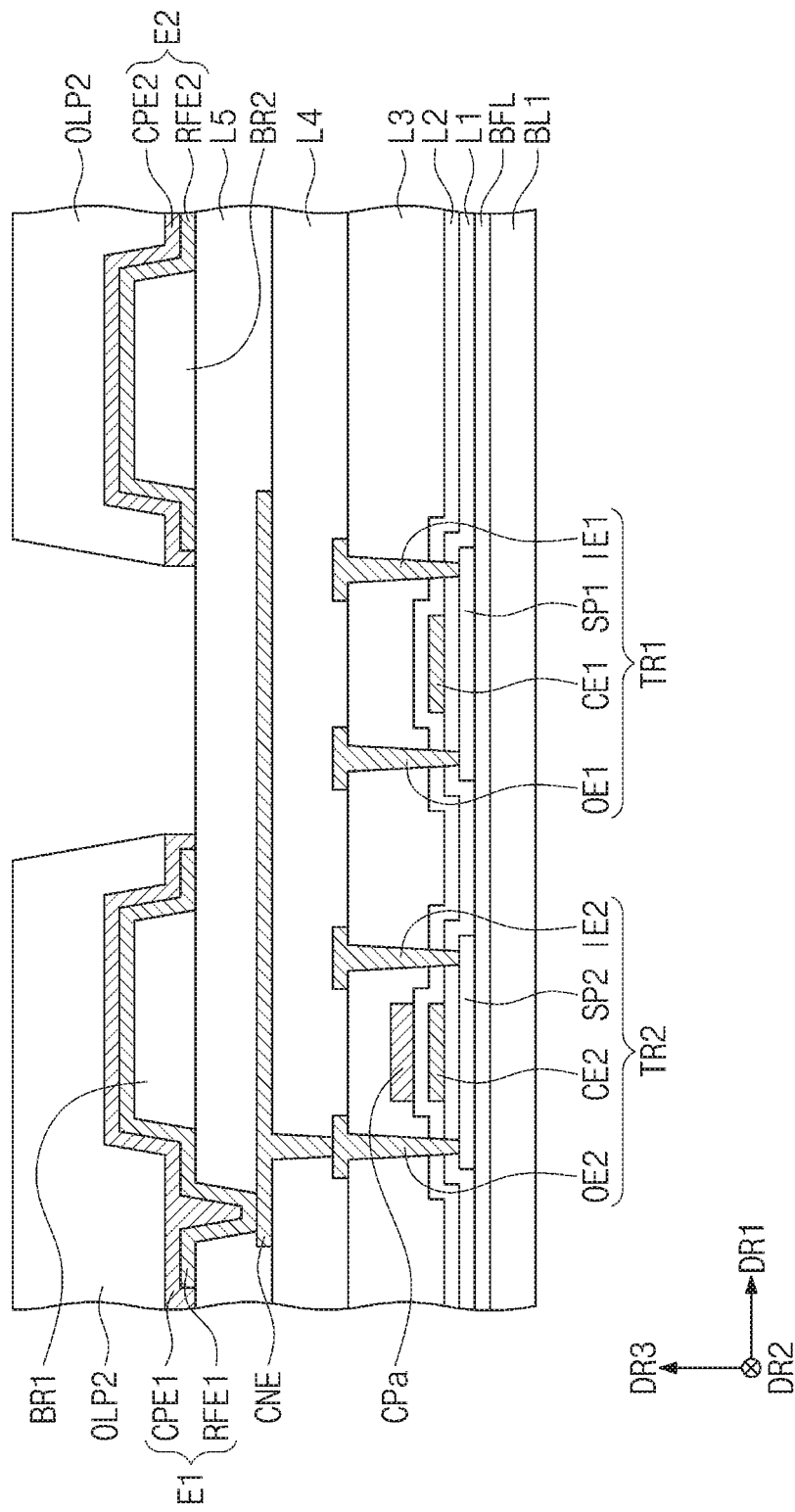

DISPLAY DEVICE AND METHOD OF MANUFACTURING THE SAME

CROSS-REFERENCE TO RELATED APPLICATION

This U.S. non-provisional patent application claims priority under 35 U.S.C. § 119 of Korean Patent Application No. 10-2018-0091721, filed on Aug. 7, 2018, the disclosure of which is hereby incorporated by reference in its entirety.

BACKGROUND

The present disclosure herein relates to a display device with improved reliability and a method of manufacturing the same.

A display device may include a plurality of light emitting elements. Each of the light emitting element may be electrically connected to an electrode and may emit light according to a voltage applied to the electrode. The light emitting element may be formed directly on the electrode, or a light emitting element that is formed separately from the electrode may be electrically connected to the electrode in a manufacturing process of the display device. When the light emitting element is separately formed and then is connected to the electrode, it may be required to precisely align the light emitting element with the electrode. A light emitting element that is misaligned with the electrode beyond a tolerable range may not properly emit light, and such a light emitting element may be visible as a defect while deteriorating a display quality of the display device.

SUMMARY

The present disclosure may provide a display device with improved reliability and a method of manufacturing the same.

In an embodiment of the inventive concepts, a display device may include a pixel circuit, a first insulating layer covering the pixel circuit, a first electrode disposed on the first insulating layer, a second electrode disposed on the first insulating layer and spaced apart from the first electrode in a first direction, and a light emitting element electrically connected to the first electrode and the second electrode and disposed between the first electrode and the second electrode. A recess may be provided in a first region of the first insulating layer between the first electrode and the second electrode, and a width of the recess in the first direction may be greater than a length of the light emitting element in the first direction. The first and second electrodes may not overlap the recess when viewed in the plan view.

In an embodiment, the light emitting element may be disposed and seated in the recess.

In an embodiment, the display device may further include a second insulating layer covering the recess and disposed between the light emitting element and the recess.

In an embodiment, a concave portion may be defined in an area of the second insulating layer that covers the recess, and the light emitting element may be disposed and seated in the concave portion.

In an embodiment, the first insulating layer may include an organic material.

In an embodiment, the display device may further include a first partition disposed between the first electrode and the first insulating layer, and a second partition disposed between the second electrode and the first insulating layer. The light emitting element may be disposed between the first partition and the second partition in the plan view.

In an embodiment, a second region of the first insulating layer except the first region having the recess may provide a flat top surface, and at least a portion of the light emitting element may be disposed under a plane including the flat top surface when viewed in a cross-sectional view.

In an embodiment, a distance between the first electrode and the second electrode in the first direction may be equal to or greater than the width of the recess in the first direction.

In an embodiment, the first electrode may be electrically connected to the pixel circuit and may include a first reflective electrode including a reflective material, and a first capping electrode covering the first reflective electrode. The second electrode may be configured to receive a power source voltage and may include a second reflective electrode including the reflective material, and a second capping electrode covering the second reflective electrode.

In an embodiment of the inventive concepts, a method of manufacturing a display device may include forming a pixel circuit on a base layer, forming a first insulating layer covering the pixel circuit, forming a conductive layer on the first insulating layer, forming a photoresist pattern on the conductive layer, forming a first electrode and a second electrode by removing a first portion of the conductive layer exposed by the photoresist pattern, forming a recess by removing a second portion, in a thickness direction of the display device, of the first insulating layer exposed by the photoresist pattern between the first electrode and the second electrode, providing a light emitting element onto the recess, and aligning the light emitting element between the first electrode and the second electrode.

In an embodiment, the forming of the conductive layer may include forming a first conductive layer, and forming a second conductive layer. The forming of the photoresist pattern may include forming a first photoresist pattern on the first conductive layer, and forming a second photoresist pattern on the second conductive layer.

In an embodiment, the first electrode may include a first reflective electrode including a reflective material, and a first capping electrode covering the first reflective electrode. The second electrode may be configured to receive a power source voltage and may include a second reflective electrode including the reflective material, and a second capping electrode covering the second reflective electrode. The forming of the first electrode and the second electrode may include forming the first photoresist pattern on the first conductive layer, forming the first reflective electrode and the second reflective electrode by removing a third portion of the first conductive layer exposed by the first photoresist pattern, forming the second conductive layer covering the first reflective electrode and the second reflective electrode after removing the first photoresist pattern, forming the second photoresist pattern on the second conductive layer, and forming the first capping electrode and the second capping electrode by removing a fourth portion of the second conductive layer exposed by the second photoresist pattern.

In an embodiment, the forming of the recess may include dry-etching the second portion, in the thickness direction, of the first insulating layer exposed between the first capping electrode and the second capping electrode before removing the second photoresist pattern.

In an embodiment, the forming of the first reflective electrode and the second reflective electrode may include wet-etching the first conductive layer, and the forming of the first capping electrode and the second capping electrode may include wet-etching the second conductive layer.

In an embodiment, the forming of the first reflective electrode and the second reflective electrodes may include wet-etching the first conductive layer, and the forming of the first capping electrode and the second capping electrode may include dry-etching the second conductive layer.

In an embodiment, the forming of the conductive layer may include forming a first conductive layer, and forming a second conductive layer. The photoresist pattern may be formed on the second conductive layer. The forming of the first electrode and the second electrode may include wet-etching the first conductive layer and the second conductive layer exposed by the photoresist pattern.

In an embodiment, the forming of the recess may include dry-etching the second portion, in the thickness direction, of the first insulating layer exposed between the first electrode and the second electrode before removing the photoresist pattern.

In an embodiment, the method may further include forming a second insulating layer covering the first electrode, the second electrode, and the recess. A concave portion may be defined in an area of the second insulating layer that corresponds to the recess, and the light emitting element may be provided onto the concave portion.

In an embodiment of the inventive concepts, a display device may include a pixel circuit, an insulating layer that covers the pixel circuit, has a recess recessed in a thickness direction in a first region of the insulating layer, and provides a flat top surface in a second region of the insulating layer except the first region having the recess, a first electrode electrically connected to the pixel circuit, a second electrode disposed on a same layer as the first electrode and spaced apart from the first electrode in a first direction with the recess interposed between the first electrode and the second electrode, and a light emitting element that overlaps the recess in a plan view and is electrically connected to the first electrode and the second electrode. The light emitting element may overlap the insulating layer in the first direction, and the first electrode and the second electrode may not overlap the recess when viewed in the plan view.

In an embodiment, a width of the recess in the first direction may be greater than a length of the light emitting element in the first direction.

BRIEF DESCRIPTION OF THE DRAWINGS

The accompanying drawings are included to provide a further understanding of the inventive concepts of the present disclosure, and are incorporated in and constitute a part of this specification. The drawings illustrate exemplary embodiments of the inventive concepts and, together with the detailed description, serve to explain principles of the inventive concepts. In the drawings:

FIGS. 7A to 7L are cross-sectional views illustrating some of processes of manufacturing a display device, according to an embodiment of the inventive concepts.

DETAILED DESCRIPTION

Figure 1:
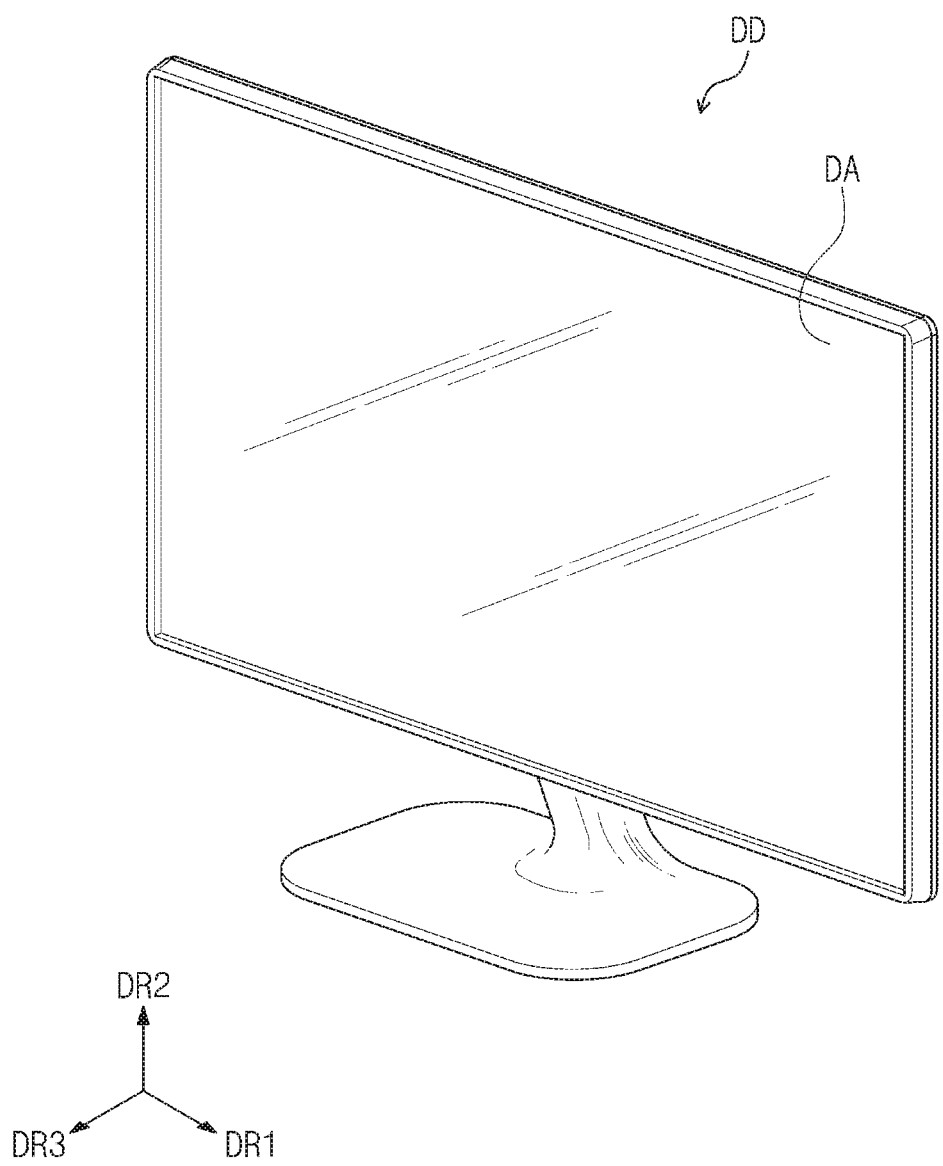
FIG. 1 is a perspective view illustrating a display device according to an embodiment of the inventive concepts.

The inventive concepts of the present disclosure now will be described more fully hereinafter with reference to the accompanying drawings, in which various embodiments are shown. The inventive concepts may, however, be embodied in many different forms and configurations, and should not be construed as limited to the embodiments set forth herein. Rather, these embodiments are provided so that the present disclosure will be thorough and complete, and will fully convey the scopes of the inventive concepts to those skilled in the art. Like reference numerals refer to like elements throughout.

It will be understood that when an element such as a layer, region or substrate is referred to as being "on" another element, it can be directly on the other element or one or more intervening elements may be present. In contrast, the term "directly" means that there may be no intervening elements between the recited two elements. As used herein, the term "and/or" includes any and all combinations of one or more of the associated listed items.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" may mean "and/or." It will be further understood that the terms "comprises" and/or "comprising," or "includes" and/or "including" when used in this specification, specify a presence of stated features, regions, integers, steps, operations, elements, and/or components, but do not preclude a presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary spatially relative term "below" can encompass both an orientation of above and below. The device may be otherwise oriented (rotated 90 degrees or at other orientations), and the spatially relative terms used herein may be interpreted accordingly.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings herein.

"About" or "approximately" as used herein is inclusive of the stated value and means within an acceptable range of deviation for a particular value or a range of particular values as determined by one of ordinary skill in the art, considering measurement and an error associated with the measurement of the particular quantity (i.e., limitations of a measurement system).

Exemplary embodiments are described herein with reference to cross-sectional illustrations and/or plane illustrations that are idealized exemplary illustrations. In the drawings, the thicknesses of layers and regions are exaggerated for clarity. Accordingly, variations from the shapes of the illustrations, for example, as a result of manufacturing techniques and/or tolerances, are to be expected. Thus, exemplary embodiments should not be construed as limited to the shapes of regions illustrated herein but are to include deviations in shapes that may result, for example, from manufacturing. For example, an etching region illustrated as a rectangle will, typically, have rounded or curved features. Thus, the regions illustrated in the figures are schematic in nature, and their shapes are not intended to illustrate an actual shape of a region of a device without limiting the scope of exemplary embodiments.

Hereinafter, exemplary embodiments of the inventive concepts will be described in detail with reference to the accompanying drawings.

FIG. 1 is a perspective view illustrating a display device according to an embodiment of the inventive concepts.

Referring to FIG. 1, a display device DD may display an image through a display area DA. In FIG. 1, the display area DA is provided in a plane defined by a first direction DR1 and a second direction DR2 that intersects the first direction DR1. However, embodiments of the inventive concepts are not limited thereto. In another embodiment, the display area of the display device DD may be provided in a curved plane.

A thickness direction of the display device DD may be indicated by a third direction DR3 that is perpendicular to the first and second directions DR1 and DR2. However, directions indicated by the first to third directions DR1, DR2 and DR3 may be relative and may be changed into other directions. The clause "when viewed in a plan view" used herein may mean "when viewed in the third direction DR3". In addition, the term "thickness direction" may correspond to the third direction DR3.

In FIG. 1, a television is illustrated as an example of the display device DD. However, in other embodiments, the display device DD may also be applied to other large-sized electronic devices (e.g., monitors and external billboards) and small and middle-sized electronic devices (e.g., personal computers, notebook computers, personal digital assistants (PDAs), car navigation units, game consoles, smart phones, tablet computers, and cameras). However, these are provided only as examples of the inventive concepts, and the display device DD according to the inventive concepts may also be applied to other electronic devices without departing the spirits and scopes of the inventive concepts.

Figure 2:
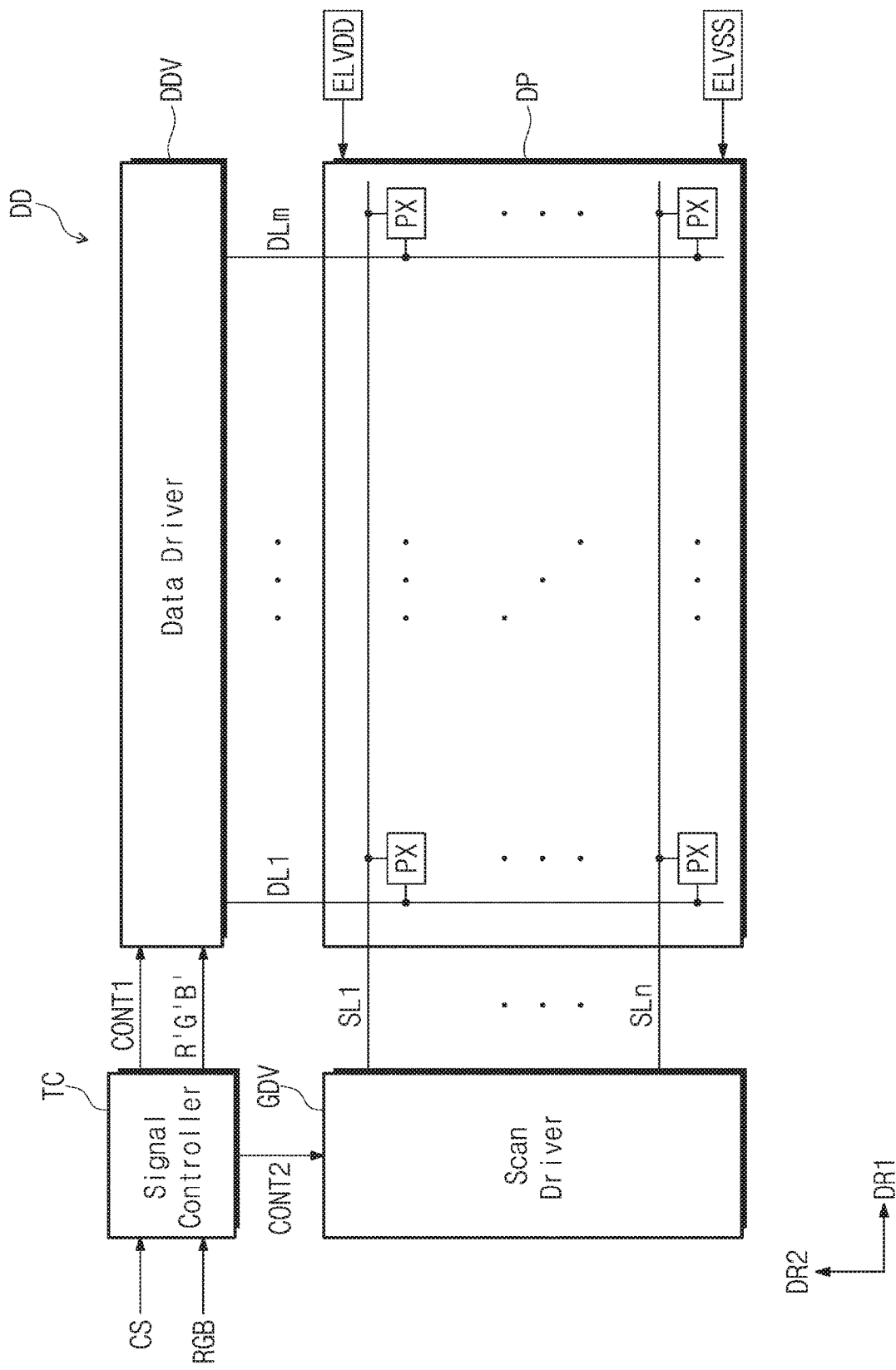
FIG. 2 is a block diagram illustrating a display device according to an embodiment of the inventive concepts.

FIG. 2 is a block diagram illustrating a display device according to an embodiment of the inventive concepts.

Referring to FIG. 2, the display device DD may include a display panel DP, a signal controller (or a timing controller) TC, a data driver DDV, and a scan driver GDV. Each of the signal controller TC, the data driver DDV, and the scan driver GDV may include an electrical circuit.

According to one embodiment, the display panel DP may be a micro-sized light emitting element display panel including a plurality of micro-sized light emitting elements. For example, the display panel DP may include a micro light emitting diode (micro LED) display panel.

The display panel DP may include a plurality of data lines DL1 to DLm, a plurality of scan lines SL1 to SLn, and a plurality of pixels PX.

The plurality of data lines DL1 to DLm may extend in the second direction DR2 and may be arranged in the first direction DR1 that intersects the second direction DR2. The plurality of scan lines SL1 to SLn may extend in the first direction DR1 and may be arranged in the second direction DR2.

Each of the pixels PX may include a light emitting element and a pixel circuit that is electrically connected to the light emitting element. The pixel circuit may include a plurality of transistors. A first power source voltage ELVDD and a second power source voltage ELVSS may be provided to each of the pixels PX.

The pixels PX may be arranged on a plane of the display panel DP with a uniform spacing interposed therebetween. Each of the pixels PX may display one of primary colors or one of mixed colors. The primary colors may include a red color, a green color, and a blue color, and the mixed colors may include various colors such as a yellow color, a cyan color, a magenta color, and a white color. However, the colors displayed by the pixels PX are not limited thereto.

The signal controller TC may receive image data RGB from an external system. The signal controller TC may convert the image data RGB into conversion image data R'G'B' that is appropriate to operations of the display panel DP and may output or provide the conversion image data R'G'B' to the data driver DDV.

In addition, the signal controller TC may receive a control signal CS from the external system. The control signal CS may include a vertical sync signal, a horizontal sync signal, a main clock signal, and a data enable signal. The signal controller TC may provide a first control signal CONT1 to the data driver DDV and may provide a second control signal CONT2 to the scan driver GDV. The first control signal CONT1 may include a signal for controlling the data driver DDV, and the second control signal CONT2 may include a signal for controlling the scan driver GDV.

The data driver DDV may drive the plurality of data lines DL1 to DLm in response to the first control signal CONT1 that is received from the signal controller TC. The data driver DDV may be implemented as an independent integrated circuit (IC) to be electrically connected to one side of the display panel DP or to be mounted directly on the display panel DP. In some embodiments, the data driver DDV may be implemented as a single chip or may include a plurality of chips.

The scan driver GDV may drive the scan lines SL1 to SLn in response to the second control signal CONT2 that is received from the signal controller TC. The scan driver GDV may be integrated in a predetermined area of the display panel DP. For example, the scan driver GDV may include a plurality of thin film transistors formed by the same process (e.g., a low-temperature polycrystalline silicon (LTPS) process or a low-temperature polycrystalline oxide (LTPO) process) as the pixel circuits of the pixels PX. Alternatively, the scan driver GDV may be implemented as an independent integrated circuit (IC) chip to be electrically connected to a side of the display panel DP.

While a gate-on voltage is applied to one of the plurality of scan lines SL1 to SLn, one or more switching transistors of pixels PX in a pixel row that are connected to the one scan line may be turned on. At this time, the data driver DDV may provide data driving signals to the data lines DL1 to DLm. The data driving signals supplied to the data lines DL1 to DLm may be applied to the pixels PX through the turned-on switching transistors of the pixels PX. The data driving signals may be analog voltages corresponding to gray scale values of the image data corresponding to each of the pixels PX.

Figure 3:
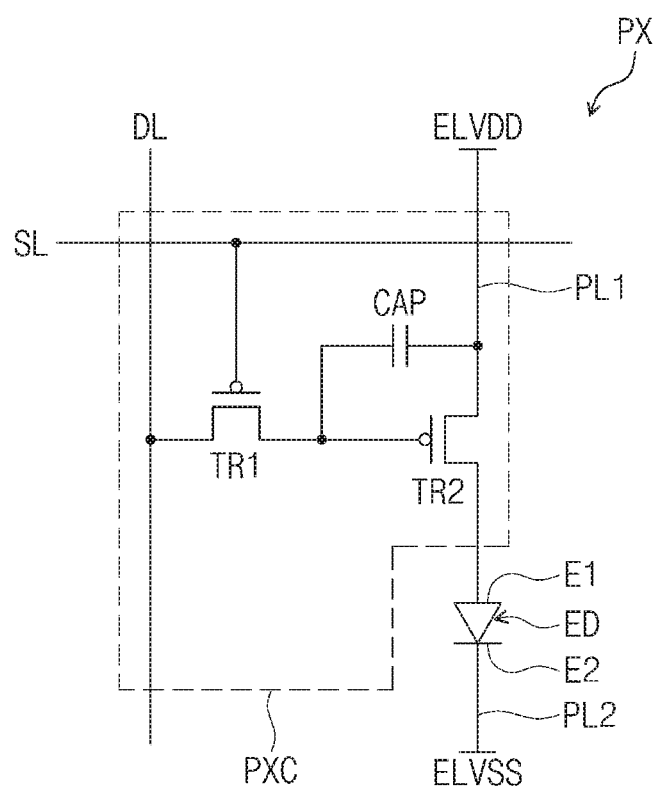
FIG. 3 is an equivalent circuit diagram of a pixel according to an embodiment of the inventive concepts.

FIG. 3 is an equivalent circuit diagram of a pixel according to an embodiment of the inventive concepts. FIG. 3 illustrates an equivalent circuit diagram of one of the plurality of pixels PX shown in FIG. 2.

Referring to FIG. 3, the pixel PX may be connected to a plurality of signal lines. In the present embodiment, the signal lines may include a scan line SL, a data line DL, a first power source line PL1, and a second power source line PL2. However, embodiments of the inventive concepts are not limited thereto. In another embodiment, the pixel PX may be additionally connected to at least one or more additional signal lines in addition to the scan line SL, the data line DL, the first power source line PL1, and the second power source line PL2.

The pixel PX may include a light emitting element ED, a first electrode E1, a second electrode E2, and a pixel circuit PXC. The pixel circuit PXC may include a first thin film transistor TR1, a capacitor CAP, and a second thin film transistor TR2. However, the numbers of the thin film transistor(s) and the capacitor(s) included in the pixel circuit PXC are not limited to those in FIG. 3. In another embodiment, the pixel circuit PXC may include seven thin film transistors and one capacitor.

The first thin film transistor TR1 may be a switching transistor configured to control on/off of the pixel PX. The first thin film transistor TR1 may transmit or block a data signal provided through the data line DL in response to a scan signal provided through the scan line SL.

The capacitor CAP may be connected to the first thin film transistor TR1 and the first power source line PL1. The capacitor CAP may be charged with charges corresponding to a difference between the data signal transmitted through the first thin film transistor TR1 and the first power source voltage ELVDD provided through the first power source line PL1.

The second thin film transistor TR2 may be connected to the first thin film transistor TR1, the capacitor CAP, and the light emitting element ED. The second thin film transistor TR2 may control a driving current that flows through the light emitting element ED in response to an amount of the charges stored in the capacitor CAP. A turn-on time of the second thin film transistor TR2 may be determined depending on the amount of the charges stored in the capacitor CAP.

According to one embodiment, the first and second thin film transistors TR1 and TR2 may be N-type thin film transistors or P-type thin film transistors. Alternatively, in another embodiment, one of the first and second thin film transistors TR1 and TR2 may be an N-type thin film transistor, and the other of the first and second thin film transistors TR1 and TR2 may be a P-type thin film transistor.

The light emitting element ED may be connected to the second thin film transistor TR2 and the second power source line PL2. For example, the light emitting element ED may be connected to the first electrode E1 of the light emitting element ED that is electrically connected to the second thin film transistor TR2 and the second electrode E2 of the light emitting element ED that is electrically connected to the second power source line PL2. Stated otherwise, the first electrode E1 may be electrically connected to the pixel circuit PXC, and the second electrode E2 may receive a power source voltage (e.g., the second power source voltage ELVSS) through the second power source line PL2.

The light emitting element ED may emit light according to a voltage difference between a signal transmitted through the second thin film transistor TR2 and the second power source voltage ELVSS received through the second power source line PL2.

According to one embodiment, the light emitting element ED may be a micro-sized LED element. The micro-sized LED element may refer to an LED element that has a length of several nanometers to hundreds micrometers. However, the length of the micro-sized LED element is not limited to the exemplary numeral range, and the micro-sized LED element may have a different length.

In FIG. 3, one light emitting element ED connected between the second thin film transistor TR2 and the second power source line PL2 is illustrated as an example. In another embodiment, the light emitting element ED may be provided in plurality. The plurality of light emitting elements ED may be connected in parallel to each other. In the following description, the light emitting element ED may represent one light emitting element as well as a plurality of light emitting elements.

Figure 4A:
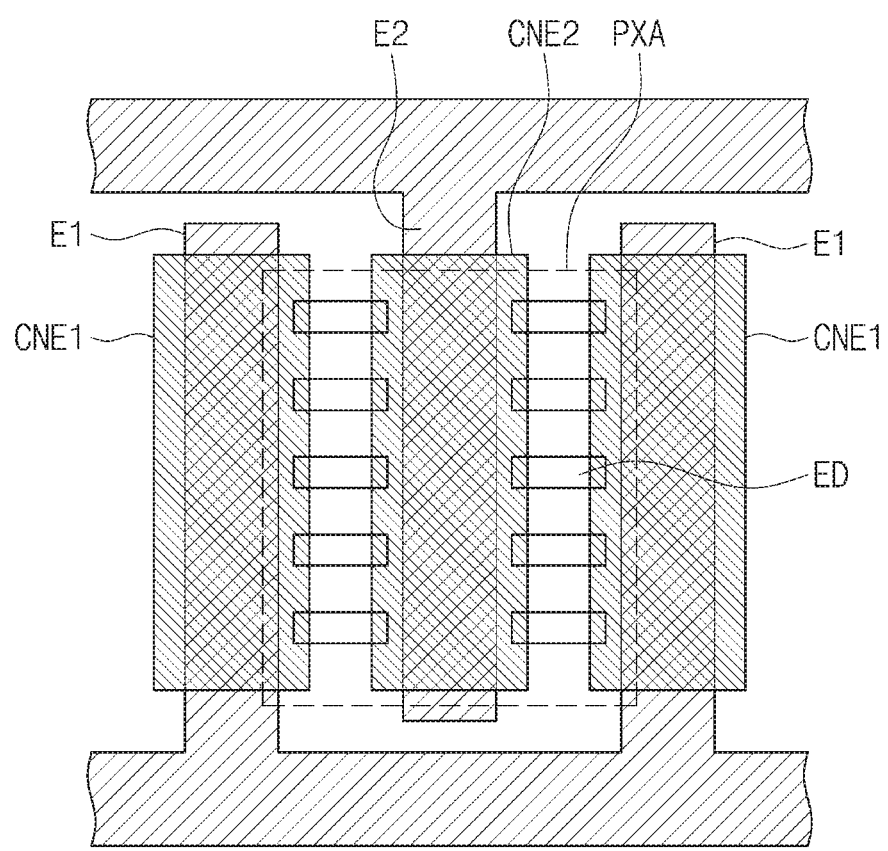
FIG. 4A is a plan view illustrating a display panel according to an embodiment of the inventive concepts.
Figure 4B:
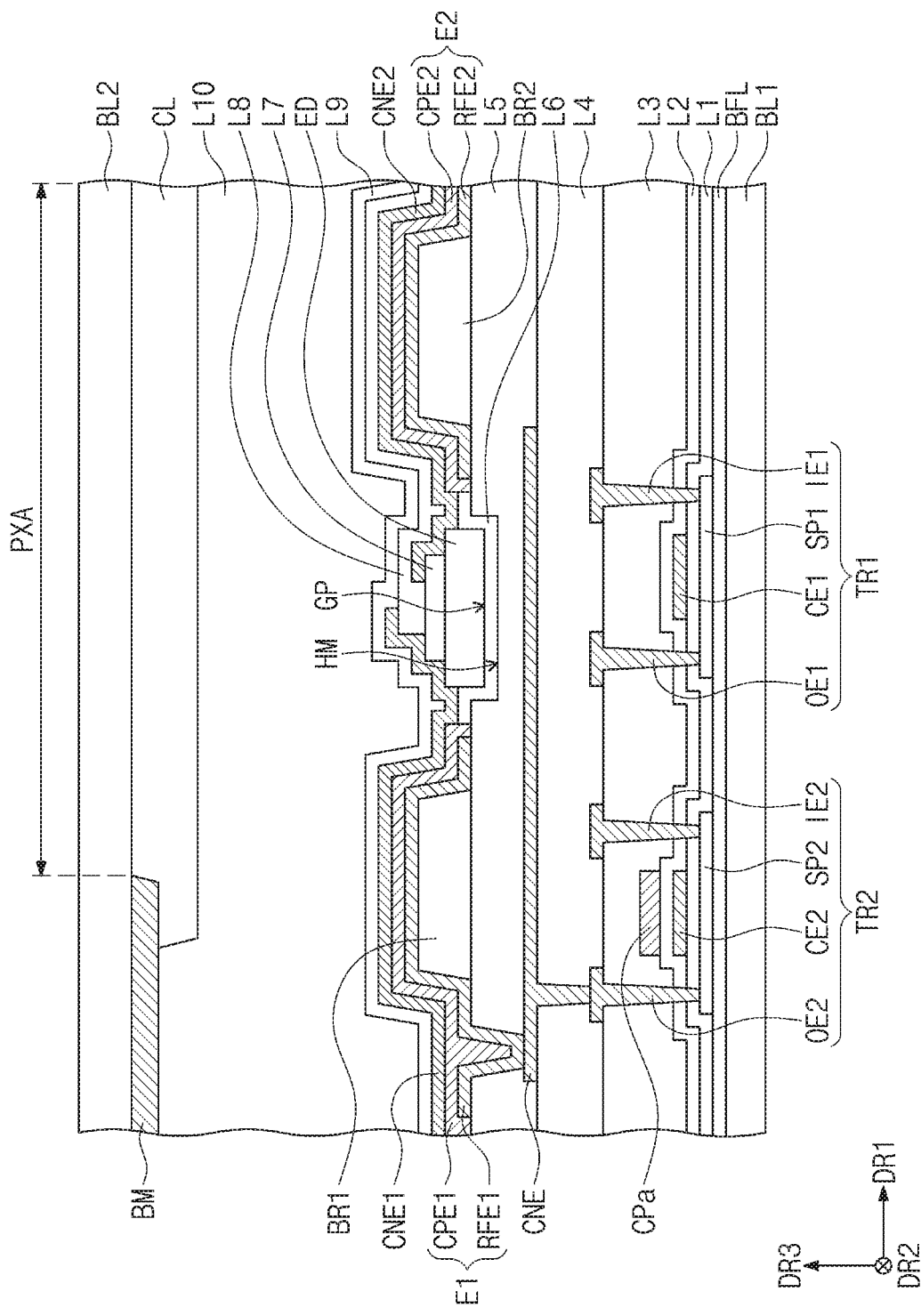
FIG. 4B is a cross-sectional view illustrating a display panel according to an embodiment of the inventive concepts.

FIG. 4A is a plan view illustrating a display panel according to an embodiment of the inventive concepts. FIG. 4B is a cross-sectional view illustrating a display panel according to an embodiment of the inventive concepts. For the purpose of ease and convenience in description and illustration, FIGS. 4A and 4B illustrate an area corresponding to one pixel and some components are omitted in FIGS. 4A and 4B.

Referring to FIGS. 4A and 4B, a first base layer BL1 and a second base layer BL2 may face each other. Each of the first and second base layers BL1 and BL2 may be a silicon substrate, a plastic substrate, a glass substrate, an insulating film, or a stacked structure including a plurality of insulating layers.

A buffer layer BFL may be disposed on the first base layer BL1. A first thin film transistor TR1 and a second thin film transistor TR2 may be disposed on the buffer layer BFL.

The first thin film transistor TR1 may include a first control electrode CE1, a first input electrode IE1, a first output electrode OE1, and a first semiconductor pattern SP1. The second thin film transistor TR2 may include a second control electrode CE2, a second input electrode 1E2, a second output electrode OE2, and a second semiconductor pattern SP2.

The first semiconductor pattern SP1 and the second semiconductor pattern SP2 may be disposed on the buffer layer BFL. The buffer layer BFL may provide a reformed or modified surface to the first semiconductor pattern SP1 and the second semiconductor pattern SP2. In this case, adhesive strength between the buffer layer BFL and the first and second semiconductor patterns SP1 and SP2 may be improved as compared with a case in which the first and second semiconductor patterns SP1 and SP2 are formed directly on the first base layer BL1. Alternatively, the buffer layer BFL may serve as a barrier layer for protecting bottom surfaces of the first semiconductor pattern SP1 and the second semiconductor pattern SP2. In this case, the buffer layer BFL may inhibit or prevent a contaminant or moisture from permeating to the first and second semiconductor patterns SP1 and SP2 from the first base layer BL1 or through the first base layer BL1.

A first insulating layer L1 may be disposed on the buffer layer BFL and may cover the first and second semiconductor patterns SP1 and SP2. The first insulating layer L1 may include an inorganic material. Examples of the inorganic material may include, but are not limited to, silicon nitride, silicon oxynitride, silicon oxide, titanium oxide, and aluminum oxide.

The first control electrode CE1 and the second control electrode CE2 may be disposed on the first insulating layer L1. A second insulating layer L2 may be disposed on the first insulating layer L1 and may cover the first control electrode CE1 and the second control electrode CE2. The second insulating layer L2 may include an inorganic material.

The capacitor CAP (see FIG. 3) may include a first capacitor electrode (not shown) and a second capacitor electrode CPa. For example, the first capacitor electrode may be branched from the second control electrode CE2, and the second capacitor electrode CPa may be disposed on the second insulating layer L2.

A third insulating layer L3 may be disposed on the second insulating layer L2 and may cover the second capacitor electrode CPa. The first input electrode IE1, the first output electrode OE1, the second input electrode IE2, and the second output electrode OE2 may be disposed on the third insulating layer L3. The first input electrode IE1 and the first output electrode OE1 may be connected to the first semiconductor pattern SP1 through respective through-holes that penetrate the first to third insulating layers L1, L2 and L3. Similarly, the second input electrode IE2 and the second output electrode OE2 may be connected to the second semiconductor pattern SP2 through respective through-holes that penetrate the first to third insulating layers L1, L2 and L3. At least a portion of each of signal lines (e.g., scan lines or data lines) as well as the first input and output electrodes IE1 and OE1 and the second input and output electrodes IE2 and OE2 may be disposed on the third insulating layer L3.

A fourth insulating layer L4 may be disposed on the third insulating layer L3 and may cover the first input electrode IE1, the first output electrode OE1, the second input electrode IE2, and the second output electrode OE2. The fourth insulating layer L4 may be a single layer or a multi-layer including a plurality of layers. The fourth insulating layer L4 may include an organic material and/or an inorganic material.

A connection electrode CNE may be disposed on the fourth insulating layer L4. In addition to the connection electrode CNE, at least another portion of each of the signal lines (e.g., the scan lines or the data lines) may be disposed on the fourth insulating layer L4. The connection electrode CNE may be connected to the second output electrode OE2.

A fifth insulating layer L5 may be disposed on the fourth insulating layer L4 and may cover the connection electrode CNE. The fifth insulating layer L5 may include an organic material. The fifth insulating layer L5 may cover the pixel circuit PXC (see FIG. 3) that is disposed thereunder. At least a portion of the fifth insulating layer L5 may provide a flat top surface. For example, the fifth insulating layer L5 may have a region in which a recess HM is defined, and a remaining region of the fifth insulating layer L5 except the region having the recess HM may provide the flat top surface.

A first partition BR1 and a second partition BR2 may be disposed on the fifth insulating layer L5. The first partition BR1 and the second partition BR2 may be spaced apart from each other in the first direction DR1. For example, each of the first and second partitions BR1 and BR2 may include an organic material.

A first electrode E1 may cover the first partition BR1, and a second electrode E2 may cover the second partition BR2. In other words, the first partition BR1 may be disposed between the first electrode E1 and the fifth insulating layer L5, and the second partition BR2 may be disposed between the second electrode E2 and the fifth insulating layer L5.

A through-hole may be provided in the fifth insulating layer L5, and at least a portion of a top surface of the connection electrode CNE may be exposed by the through-hole. The first electrode E1 may be electrically connected to the exposed portion of the connection electrode CNE. Even though not shown in the drawings, the second electrode E2 may be electrically connected to the second power source line PL2 (see FIG. 3). In other words, the second power source voltage ELVSS (see FIG. 3) may be provided to the second electrode E2.

The first electrode E1 may include a first reflective electrode RFE1 and a first capping electrode CPE1, and the second electrode E2 may include a second reflective electrode RFE2 and a second capping electrode CPE2.

Each of the first and second reflective electrodes RFE1 and RFE2 may include a reflective material. Each of the first and second reflective electrodes RFE1 and RFE2 may have a single-layered structure or a multi-layered structure. For example, each of the first and second reflective electrodes RFE1 and RFE2 may have a structure in which an indium tin oxide (ITO) layer, a silver (Ag) layer, and an indium tin oxide (ITO) layer are sequentially stacked.

The first capping electrode CPE1 may cap the first reflective electrode RFE1, and the second capping electrode CPE2 may cap the second reflective electrode RFE2. For example, each of the first and second capping electrodes CPE1 and CPE2 may include at least one of indium zinc oxide (IZO), indium tin oxide (ITO), indium gallium oxide (IGO), and indium zinc gallium oxide (IZGO), or any mixture/compound thereof.

The recess HM may be provided in a region of the fifth insulating layer L5 between the first electrode E1 and the second electrode E2 when viewed in a plan view. The recess HM may not overlap the first electrode E1 and the second electrode E2 when viewed in the plan view and/or in the third direction DR3.

A sixth insulating layer L6 may be disposed on the recess HM. The sixth insulating layer L6 may include an inorganic material. A concave portion GP may be defined in an area of the sixth insulating layer L6 that corresponds to the recess HM. For example, the recess HM may overlap the concave portion GP when viewed in a plan view. In another embodiment, the sixth insulating layer L6 may be omitted.

The light emitting element ED may be disposed on the sixth insulating layer L6. The light emitting element ED may be disposed between the first electrode E1 and the second electrode E2 when viewed in a plan view. The light emitting element ED may be electrically connected to the first electrode E1 and the second electrode E2. The light emitting element ED may be disposed and seated in the recess HM and the concave portion GP between the first and second electrodes E1 and E2.

Referring to FIG. 4A, the first electrode E1 and the second electrode E2 are illustrated. Each of the first and second electrodes E1 and E2 may extend in the second direction DR2, and the first and second electrodes E1 and E2 may be spaced apart from each other in the first direction DR1. However, embodiments of the inventive concepts are not limited to FIG. 4A. The structures of the first and second electrodes E1 and E2 may be variously modified in a state in which they are spaced apart from each other with an appropriate spatial interval. FIG. 4A illustrates a structure in which the second electrode E2 extending downwardly in the second direction DR2 is provided between two first electrodes E1 that extend upwardly in the second direction DR2.

The light emitting element ED may be disposed between the first electrode E1 and the second electrode E2 and may not overlap the first and second electrodes E1 and E2 when viewed in a plan view. The light emitting element ED may be provided in plurality, and the plurality of light emitting elements ED may be connected in parallel to each other. The light emitting element ED may be electrically connected to the first electrode E1 by a first connection electrode CNE1 and may be electrically connected to the second electrode E2 by a second connection electrode CNE2.

A seventh insulating layer (or an insulating pattern) L7 may be disposed on the light emitting element ED. The seventh insulating layer L7 may cover at least a portion of a top surface of the light emitting element ED.

The second connection electrode CNE2 may be disposed on at least a portion of a top surface of the light emitting element ED and the second electrode E2. An eighth insulating layer L8 may be disposed on the second connection electrode CNE2. The first connection electrode CNE1 may be disposed on at least an opposite portion of the top surface of the light emitting element ED and the first electrode E1. Even though the length of the light emitting element ED is hundreds micrometers or less, the second connection electrode CNE2 and the first connection electrode CNE1 may not be in direct contact with each other, due to the eighth insulating layer L8. However, embodiments of the inventive concepts are not limited thereto. In another embodiment, the first and second connection electrodes CNE1 and CNE2 may simultaneously be formed by the same process.

The first and second connection electrodes CNE1 and CNE2 may include a conductive material. For example, the conductive material may include at least one of indium zinc oxide (IZO), indium tin oxide (ITO), indium gallium oxide (IGO), and indium zinc gallium oxide (IZGO), or any mixture/compound thereof. However, embodiments of the inventive concepts are not limited thereto. For another example, the conductive material may be a metal material including, for example, molybdenum, silver, titanium, copper, and aluminum, or any alloy thereof.

A ninth insulating layer L9 may be disposed on the first connection electrode CNE1 and the eighth insulating layer L8. The ninth insulating layer L9 may be an encapsulation layer.

A light blocking layer BM may be disposed on one surface of the second base layer BL2 that faces the first base layer BL1. An opening may be provided in the light blocking layer BM, and a wavelength conversion part CL may cover the opening. An area exposed by the opening may correspond to a pixel light emitting area PXA.

The wavelength conversion part CL may include an illuminant. For example, the illuminant may absorb first light provided from the light emitting element ED and may convert a wavelength of the first light into a wavelength of second light that corresponds to a different color from that of the first light. In other words, the illuminant may convert the first light into the second light and may emit the second light. The illuminant may be, for example, a quantum dot. The first light may be blue light, and the second light may be green light or red light. However, embodiments of the inventive concepts are not limited thereto. In another embodiment, the wavelength conversion part CL may be replaced with a color filter. The color filter may absorb light of a specific wavelength to emit light of a specific color. In still another embodiment, the wavelength conversion part CL may be omitted. In this case, the light emitting element ED may emit blue light, green light, or red light.

A tenth insulating layer L10 may be disposed between the wavelength conversion part CL and the ninth insulating layer L9. For example, the tenth insulating layer L10 may be used to couple the first base layer BL1 on which the pixel circuit PXC (see FIG. 3) and the light emitting element ED are disposed to the second base layer BL2 on which the wavelength conversion part CL and the light blocking layer BM are disposed. For example, the tenth insulating layer L10 may include an optically clear adhesive film, an optically clear resin, or a pressure sensitive adhesive film. However, embodiments of the inventive concepts are not limited thereto. In another embodiment, the tenth insulating layer L10 may be omitted.

Figure 5A:
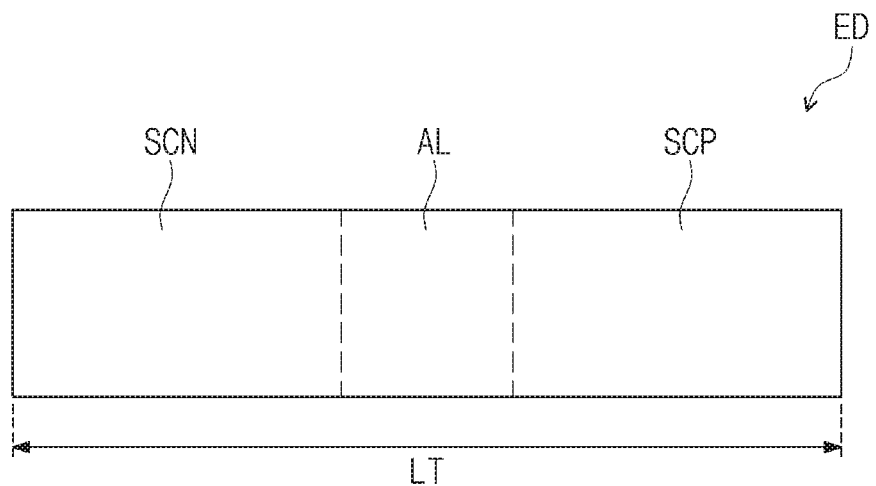
FIG. 5A is a cross-sectional view illustrating a light emitting element according to an embodiment of the inventive concepts.

FIG. 5A is a cross-sectional view illustrating a light emitting element according to an embodiment of the inventive concepts.

Referring to FIG. 5A, the light emitting element ED may have one of various shapes such as a circular cylindrical shape and a polygonal pillar shape.

The light emitting element ED may include an N-type semiconductor layer SCN, a P-type semiconductor layer SCP, and an active layer AL. The active layer AL may be disposed between the N-type semiconductor layer SCN and the P-type semiconductor layer SCP.

The N-type semiconductor layer SCN may be provided by doping a semiconductor layer with N-type dopants, and the P-type semiconductor layer SCP may be provided by doping the semiconductor layer with P-type dopants. The semiconductor layer may include a semiconductor material. Examples of the semiconductor material may include, but are not limited to, gallium nitride (GaN), aluminum nitride (AlN), aluminum gallium nitride (AlGaN), indium gallium nitride (InGaN), indium nitride (InN), indium aluminum gallium nitride (InAlGaN), and aluminum indium nitride (AlInN). Examples of the N-type dopants may include, but are not limited to, silicon (Si), germanium (Ge), tin (Sn), selenium (Se), and tellurium (Te), or any combination thereof. Examples of the P-type dopants may include, but are not limited to, magnesium (Mg), zinc (Zn), calcium (Ca), strontium (Sr), and barium (Ba), or any combination thereof.

The active layer AL may have at least one of a single quantum well structure, a multiple quantum well structure, a quantum wire structure, and a quantum dot structure. In the active layer AL, electrons injected through the N-type semiconductor layer SCN may be recombined with holes injected through the P-type semiconductor layer SCP. The active layer AL may be a layer configured to emit light having energy determined by an intrinsic energy band of the semiconductor material. The position of the active layer AL in the light emitting element ED may be variously changed depending on a type of the light emitting element ED.

The N-type semiconductor layer SCN may be connected to one of the first and second electrodes E1 and E2 (see FIG. 4B), and the P-type semiconductor layer SCP may be connected to the other of the first and second electrodes E1 and E2. A length LT of the light emitting element ED may range from several nanometers to hundreds micrometers. For example, the length LT of the light emitting element ED may range from 1 micrometer to 100 micrometers.

Figure 5B:
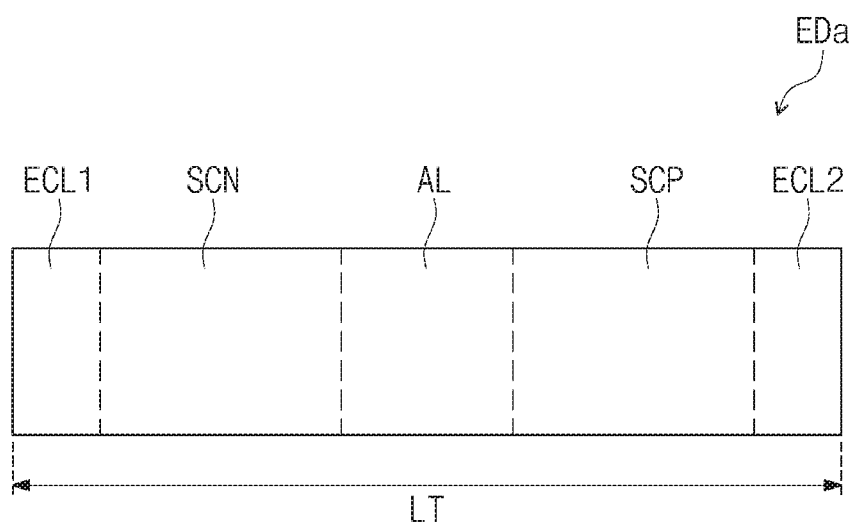
FIG. 5B is a cross-sectional view illustrating a light emitting element according to another embodiment of the inventive concepts.

FIG. 5B is a cross-sectional view illustrating a light emitting element according to another embodiment of the inventive concepts.

Referring to FIG. 5B, a light emitting element EDa may further include a first electrode layer ECL1 and a second electrode layer ECL2, as compared with the light emitting element ED shown in FIG. 5A.

The first electrode layer ECL1 may be adjacent to the N-type semiconductor layer SCN, and the second electrode layer ECL2 may be adjacent to the P-type semiconductor layer SCP. For example, the first electrode layer ECL1, the N-type semiconductor layer SCN, the active layer AL, the P-type semiconductor layer SCP, and the second electrode layer ECL2 may be sequentially arranged or stacked along a longitudinal direction of the light emitting element EDa.

Each of the first and second electrode layers ECL1 and ECL2 may be formed of a metal or an alloy of metals. For example, each of the first and second electrode layers ECL1 and ECL2 may be formed of molybdenum (Mo), chromium (Cr), nickel (Ni), gold (Au), aluminum (Al), titanium (Ti), platinum (Pt), vanadium (V), tungsten (W), lead (Pb), palladium (Pd), copper (Cu), rhodium (Rh), iridium (Ir), or any alloy thereof. The first electrode layer ECL1 and the second electrode layer ECL2 may include the same material or different materials.

Figure 5C:
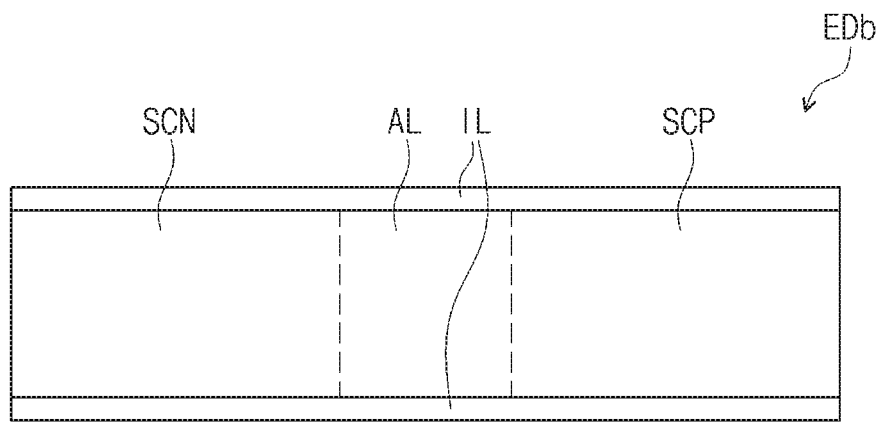
FIG. 5C is a cross-sectional view illustrating a light emitting element according to another embodiment of the inventive concepts.

FIG. 5C is a cross-sectional view illustrating a light emitting element according to another embodiment of the inventive concepts.

Referring to FIG. 5C, a light emitting element EDb may further include an insulating layer IL, as compared with the light emitting element ED shown in FIG. 5A. For example, the light emitting element EDb may have a core-shell structure.

The insulating layer IL may cover the N-type semiconductor layer SCN, the P-type semiconductor layer SCP, and the active layer AL and may protect outer surfaces of the N-type semiconductor layer SCN, the P-type semiconductor layer SCP and the active layer AL. In another embodiment, the insulating layer IL may cover only the active layer AL.

Figure 5D:
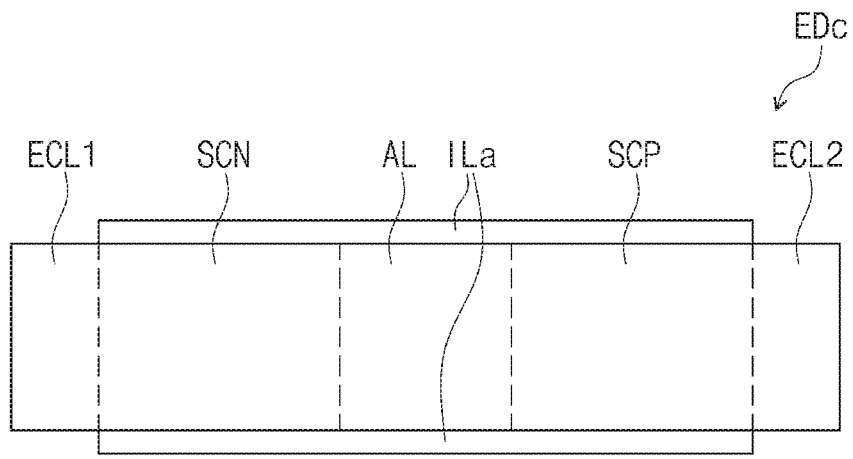
FIG. 5D is a cross-sectional view illustrating a light emitting element according to another embodiment of the inventive concepts.

FIG. 5D is a cross-sectional view illustrating a light emitting element according to another embodiment of the inventive concepts.

Referring to FIG. 5D, a light emitting element EDc may further include an insulating layer ILa, as compared with the light emitting element EDa shown in FIG. 5B.

The insulating layer ILa may cover the N-type semiconductor layer SCN, the P-type semiconductor layer SCP, and the active layer AL but may not cover the first electrode layer ECL1 and the second electrode layer ECL2. However, in other embodiments, the insulating layer ILa may cover at least a portion of the first and second electrode layers ECL1 and ECL2 or may fully cover the first and second electrode layers ECL1 and ECL2.

Figure 6:
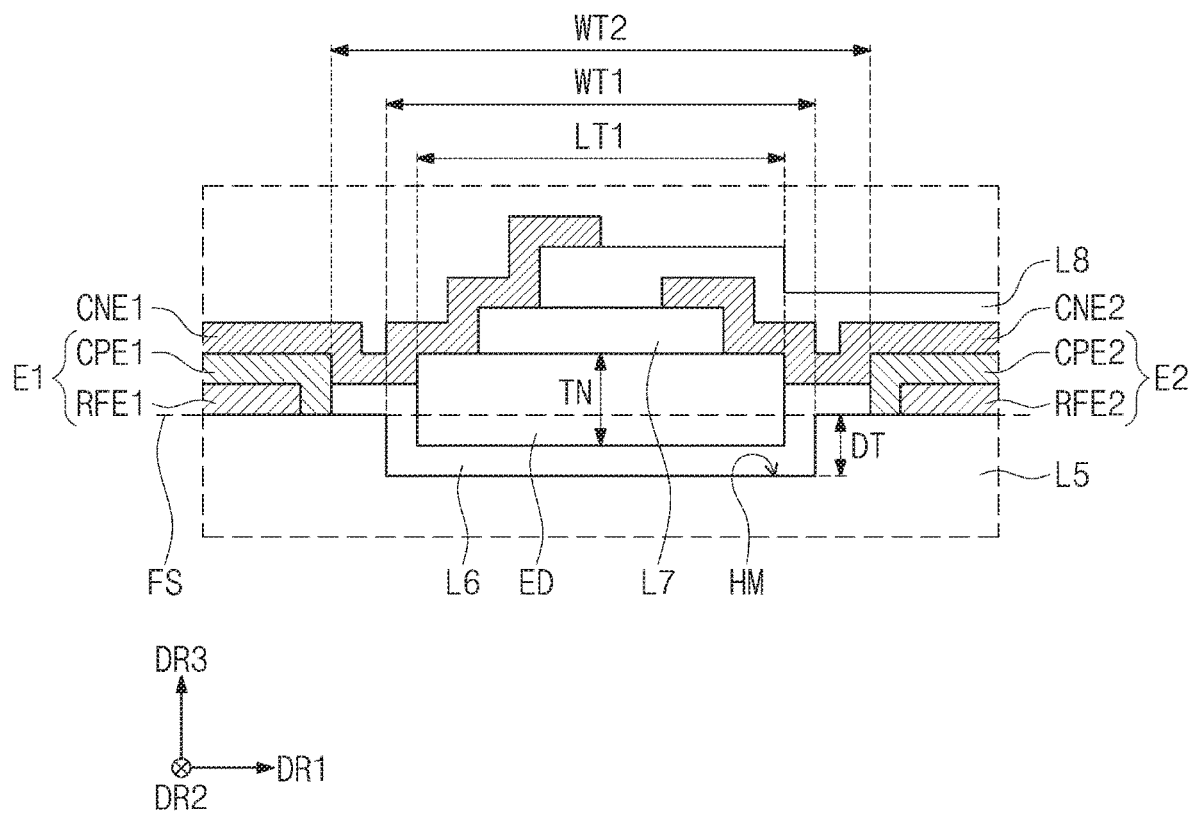
FIG. 6 is an enlarged cross-sectional view of a portion of FIG. 4B.

FIG. 6 is an enlarged cross-sectional view of a portion of FIG. 4B.

Referring to FIG. 6, the recess HM may be formed in a process of forming the first electrode E1 and the second electrode E2. Thus, a width WT1 of the recess HM measured in the first direction DR1 may be less than a distance WT2 between the first and second electrodes E1 and E2. The width WT1 of the recess HM may be greater than a length LT1 of the light emitting element ED. For example, when the length LT1 of the light emitting element ED is 3.5 micrometers, the width WT1 of the recess HM may be greater than 3.5 micrometers. Thus, the light emitting element ED may be disposed and seated in the recess HM, and a longitudinal direction of the light emitting element ED may be substantially aligned in parallel to the direction (e.g., the first direction DR1) in which the first and second electrodes E1 and E2 are spaced apart from each other, when viewed in a plan view as shown in FIG. 4A.

As shown in FIG. 6, the width WT1 of the recess HM may correspond to a width of the recess HM in the first direction DR1, and the distance WT2 between the first and second electrodes E1 and E2 may correspond to a distance in the first direction DR1 between the first and second electrodes E1 and E2. The length LT1 of the light emitting element ED may correspond to a length of the light emitting element ED in the first direction DR1.

At least a portion of the light emitting element ED may be disposed and seated in the recess HM. In other words, at least a portion of the light emitting element ED may be disposed under a plane FS extending from the flat top surface of the fifth insulating layer L5. The plane FS may be an imaginary flat surface extending between two top surfaces of the fifth insulating layer L5 that are on opposite edges of the recess HM. In FIG. 6, the plane FS is illustrated as a dotted line for the purpose of ease and convenience in description and illustration. In other words, the light emitting element ED may overlap the fifth insulating layer L5 when viewed in the first direction DR1. In addition, the light emitting element ED may not overlap the first and second electrodes E1 and E2 when viewed in a plan view.

According to the embodiments of the inventive concepts, since the recess HM is provided between the first and second electrodes E1 and E2, and a residue of the conductive material that may remain between the first and second electrodes E1 and E2 after forming the first and second electrodes E1 and E2 may be removed while forming the recess HM, an electrical short between the first and second electrodes E1 and E2 that may be caused by the residue of the conductive material can be prevented. In addition, the light emitting element ED may be seated in the recess HM, so that the light emitting element ED may be easily aligned between the first and second electrodes E1 and E2.

A depth DT of the recess HM may range from 10% to 300% of a thickness TN of the light emitting element ED. For example, the depth DT of the recess HM may range from 50% to 100% of the thickness TN of the light emitting element ED. However, the depth DT of the recess HM is not limited to the aforementioned ranges with respect to the thickness TN of the light emitting element ED.

The depth DT of the recess HM may correspond to a distance from the plane FS extending from the flat top surface of the fifth insulating layer L5 to a bottom surface of the recess HM. The thickness TN of the light emitting element ED may be the maximum thickness in a direction perpendicular to the length LT1 of the light emitting element ED. For example, when the light emitting element ED has the circular cylindrical shape, the thickness TN of the light emitting element ED may correspond to a diameter of the light emitting element ED.

FIGS. 7A to 7L are cross-sectional views illustrating some of processes of manufacturing a display device, according to an embodiment of the inventive concepts. FIGS. 7A to 7L illustrate some of processes of manufacturing the display panel of FIG. 4B. Detailed descriptions to the same components as described with respect to FIG. 4B will be omitted.

Figure 7A:
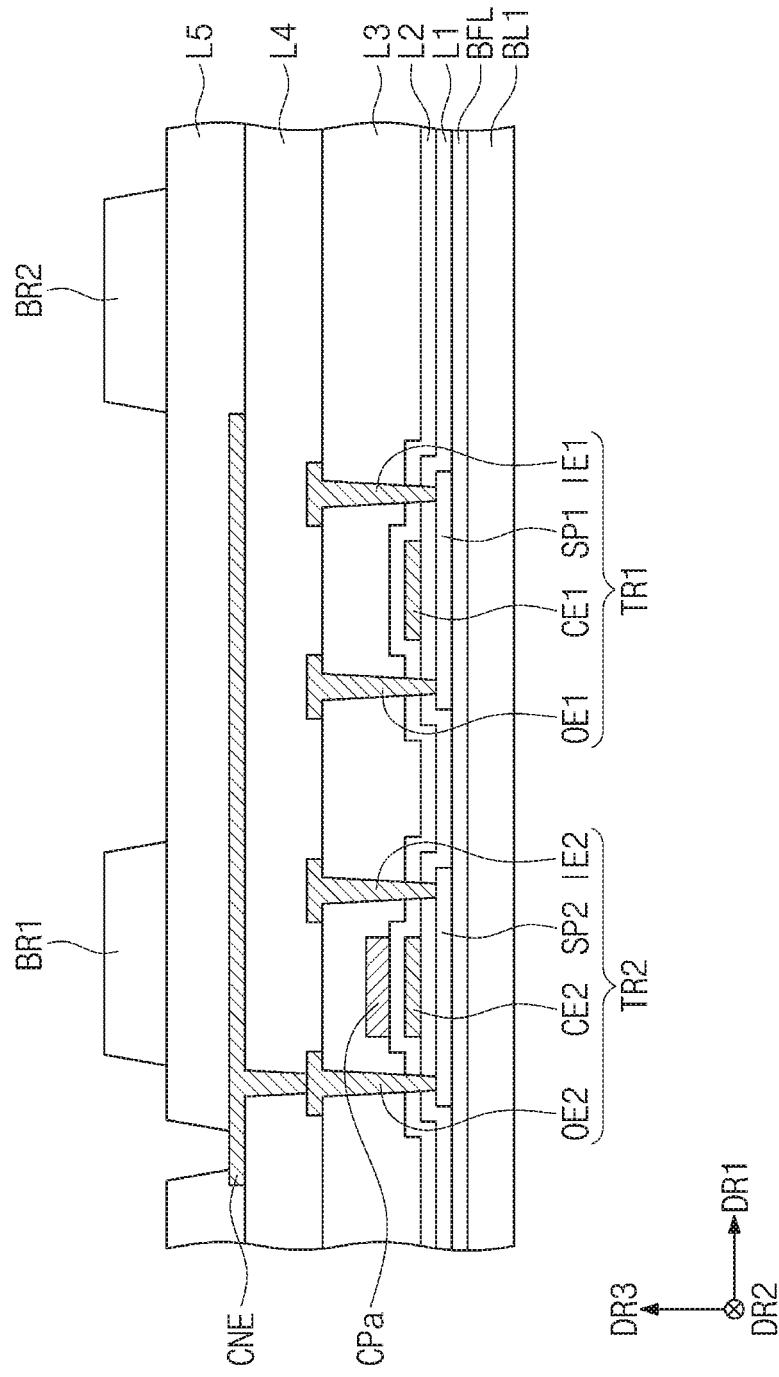

Referring to FIG. 7A, the first base layer BL1 may be prepared. Even though not shown in the drawings, the first base layer BL1 may be disposed on a work substrate (not shown) in manufacturing processes of the display panel. After a display panel is manufactured, the work substrate may be removed.

The pixel circuit PXC (see FIG. 3) including the first and second thin film transistors TR1 and TR2 may be formed on the first base layer BL1. The fifth insulating layer L5 covering the pixel circuit PXC may be formed on the first base layer BL1. The fifth insulating layer L5 may include an organic material. At least a portion of the fifth insulating layer L5 may provide a flat top surface. The first partition BR1 and the second partition BR2 may be formed on the fifth insulating layer L5.

Figure 7B:
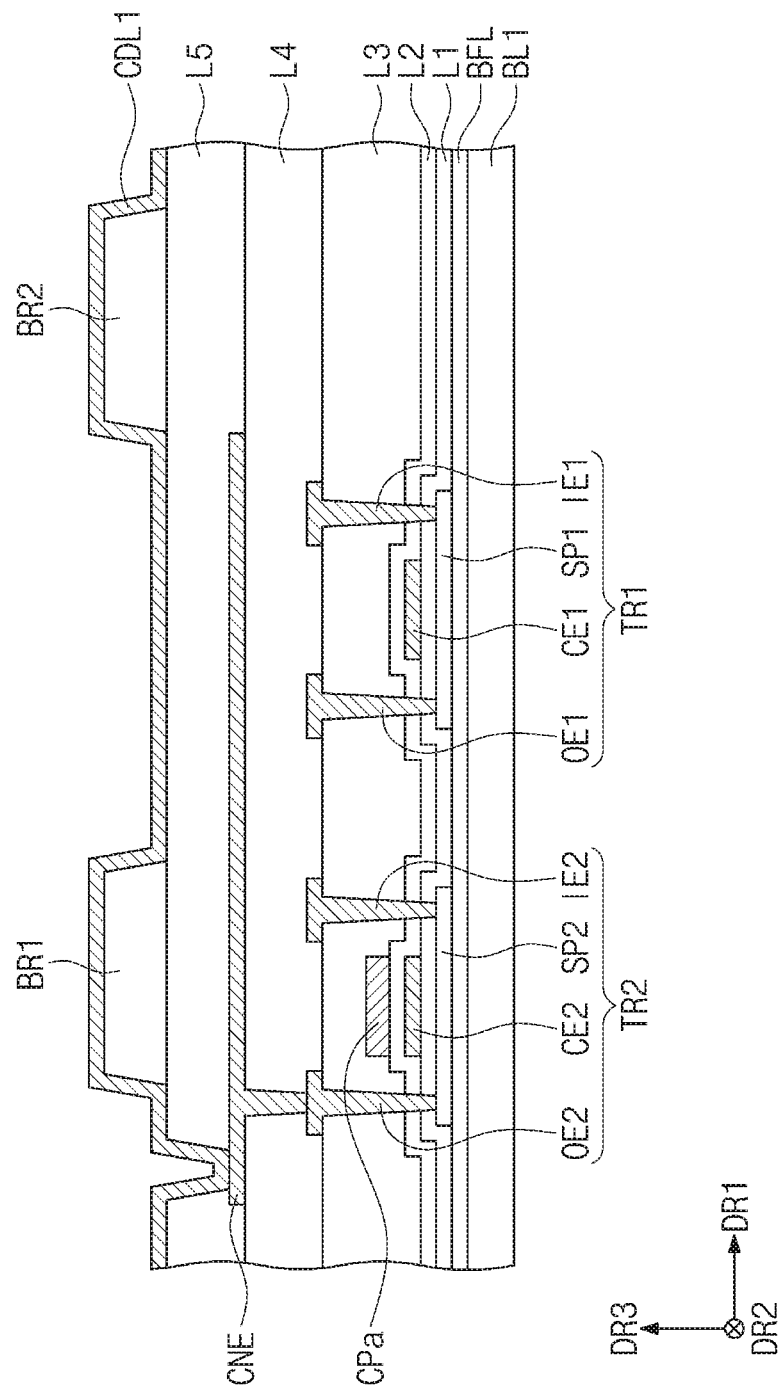

Referring to FIG. 7B, a first conductive layer CDL1 covering the first and second partitions BR1 and BR2 may be formed on the fifth insulating layer L5. The first conductive layer CDL1 may include a plurality of conductive layers. For example, the first conductive layer CDL1 may include a first indium tin oxide (ITO) layer, a silver (Ag) layer, and a second indium tin oxide (ITO) layer that are sequentially stacked.

Figure 7C:
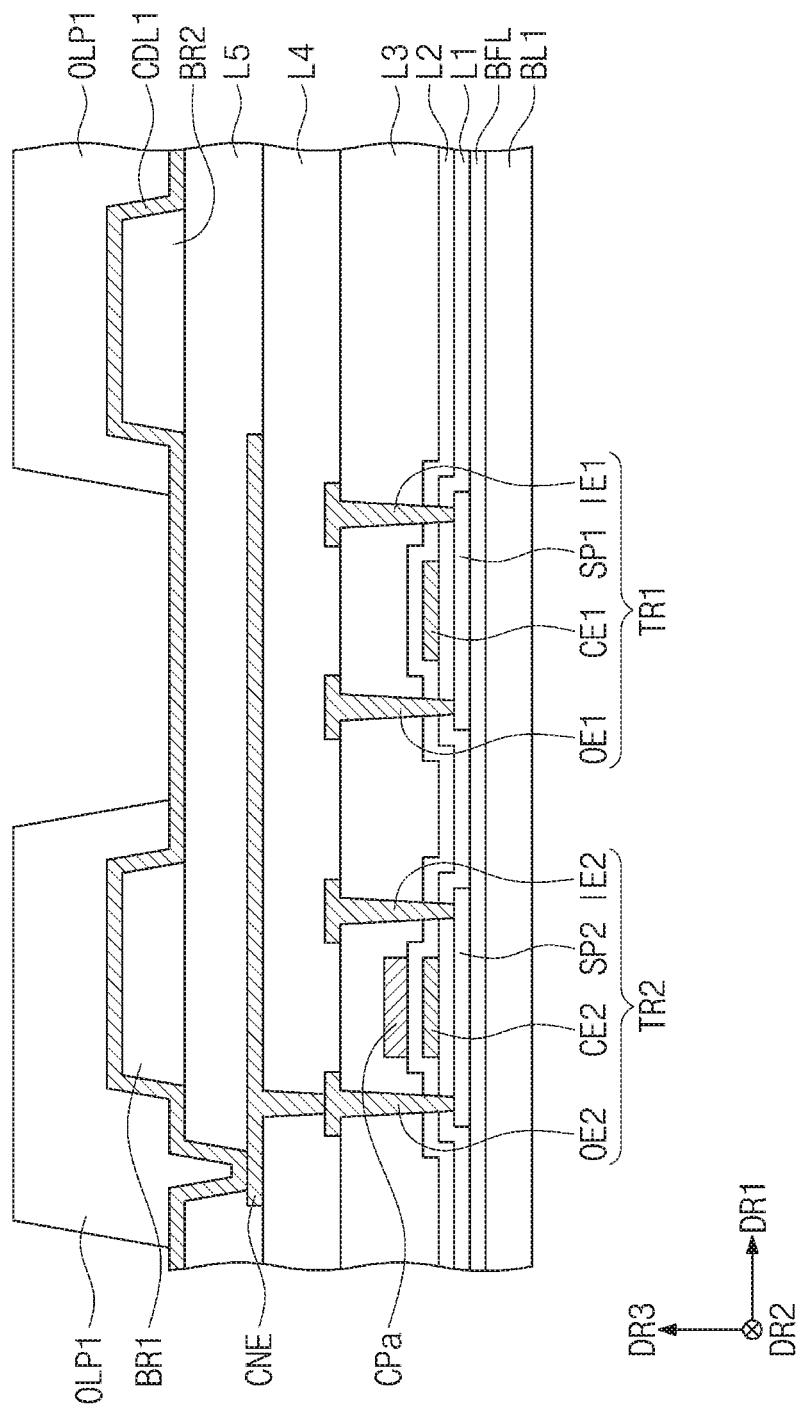

Referring to FIG. 7C, a first photoresist pattern OLP1 may be formed on the first conductive layer CDL1. A positive photoresist layer or a negative photoresist layer may be formed and then may be patterned to form the first photoresist pattern OLP1. For example, a patterning process to form the display panel may include an exposure process and a development process.

Figure 7D:
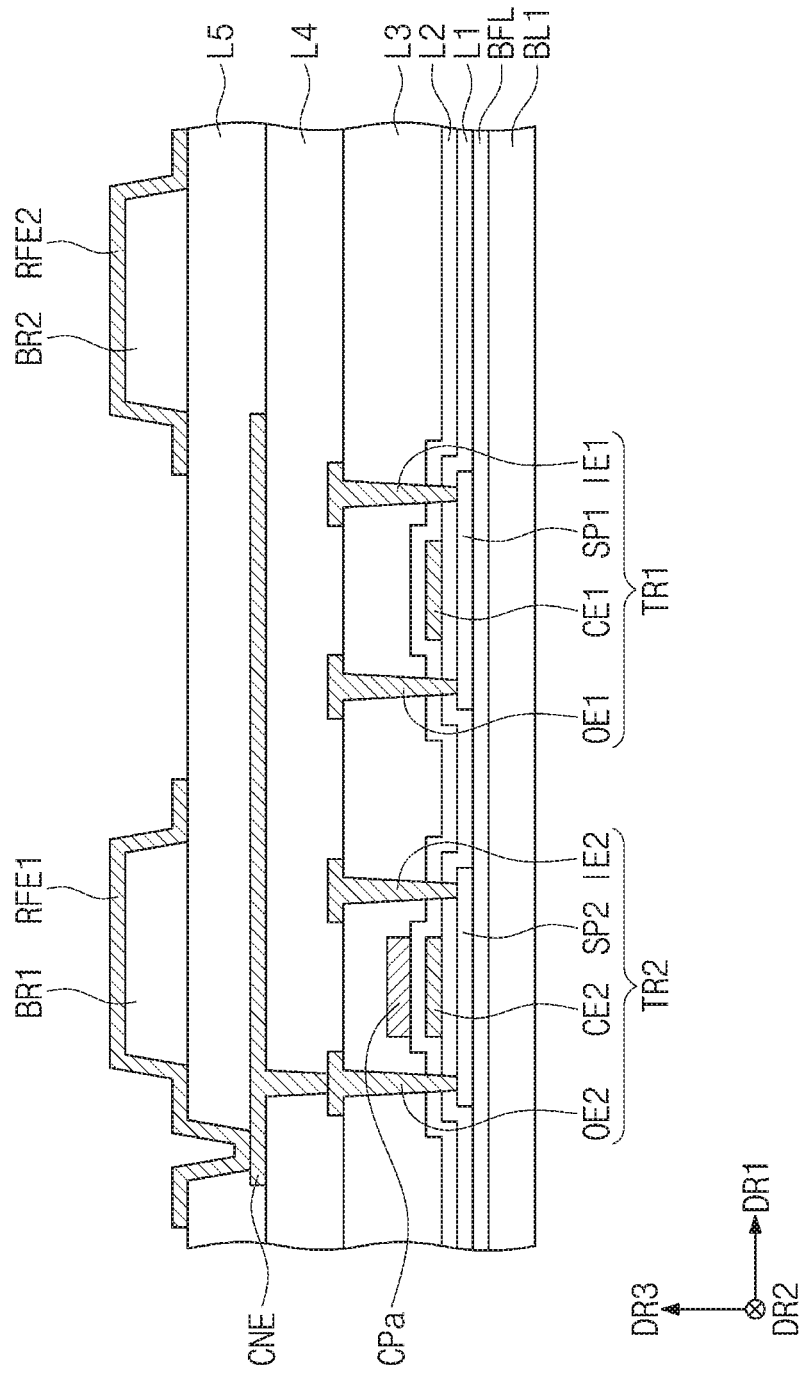

Referring to FIGS. 7C and 7D, a portion of the first conductive layer CDL1 that is exposed by the first photoresist pattern OLP1 may be removed. For example, the exposed portion of the first conductive layer CDL1 may be removed by a wet etching process.

The first reflective electrode RFE1 and the second reflective electrode RFE2 may be formed by the removal of the exposed portion of the first conductive layer CDL1. The first photoresist pattern OLP1 may be removed after the formation of the first reflective electrode RFE1 and the second reflective electrode RFE2.

Figure 7E:
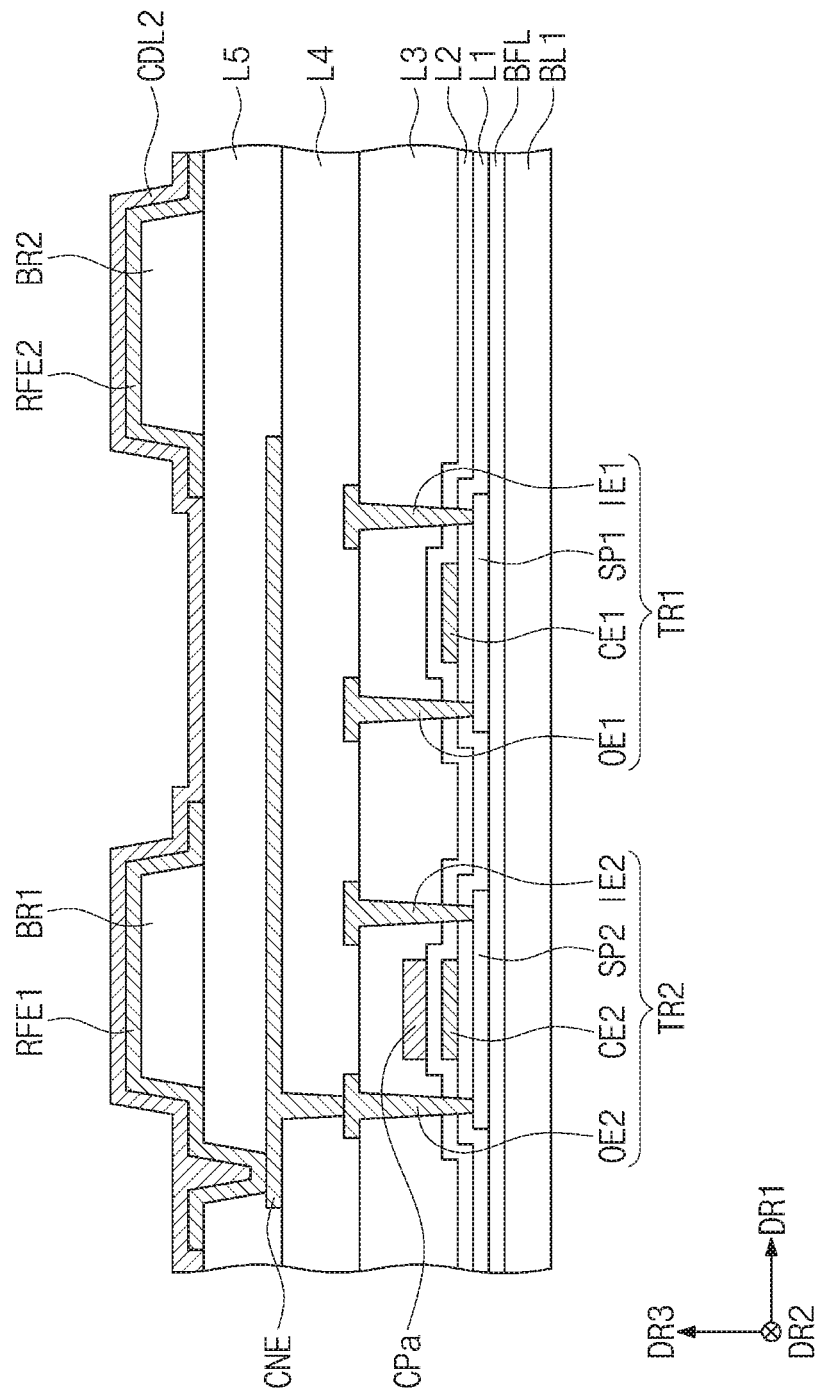

Referring to FIG. 7E, a second conductive layer CDL2 may be formed to cover the first and second reflective electrodes RFE1 and RFE2. For example, the second conductive layer CDL2 may include at least one of indium zinc oxide (IZO), indium tin oxide (ITO), indium gallium oxide (IGO), and indium zinc gallium oxide (IZGO), or any mixture/compound thereof.

Figure 7F:
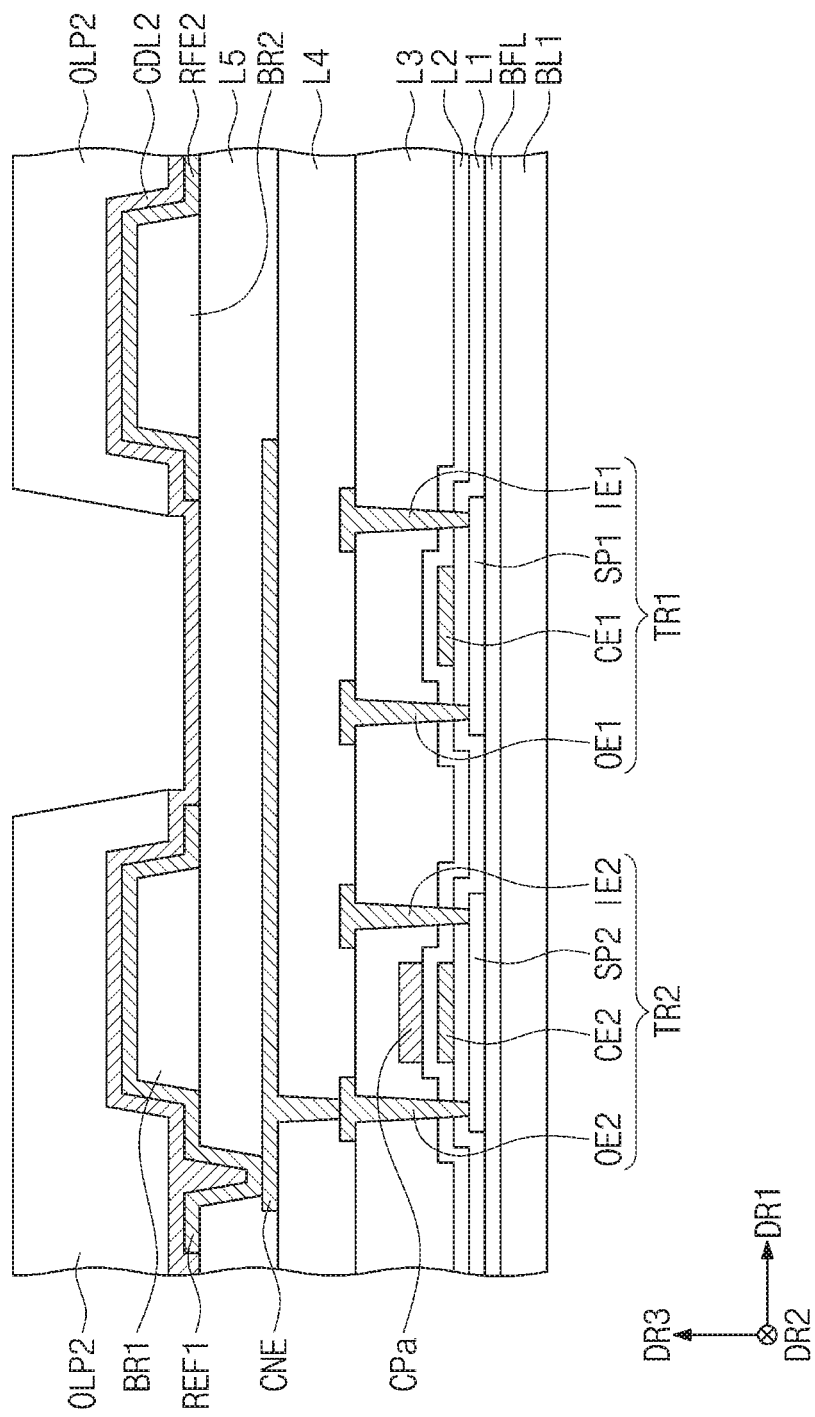

Referring to FIGS. 7F and 7G, a second photoresist pattern OLP2 may be formed on the second conductive layer CDL2. A positive photoresist layer or a negative photoresist layer may be formed and then may be patterned to form the second photoresist pattern OLP2. For example, a patterning process to form the second photoresist pattern OLP2 may include an exposure process and a development process.

A portion of the second conductive layer CDL2 that is exposed by the second photoresist pattern OLP2 may be removed. For example, the exposed portion of the second conductive layer CDL2 may be removed by a wet etching process or a dry etching process. The first capping electrode CPE1 and the second capping electrode CPE2 may be formed by the removal of the exposed portion of the second conductive layer CDL2.

Figure 7H:
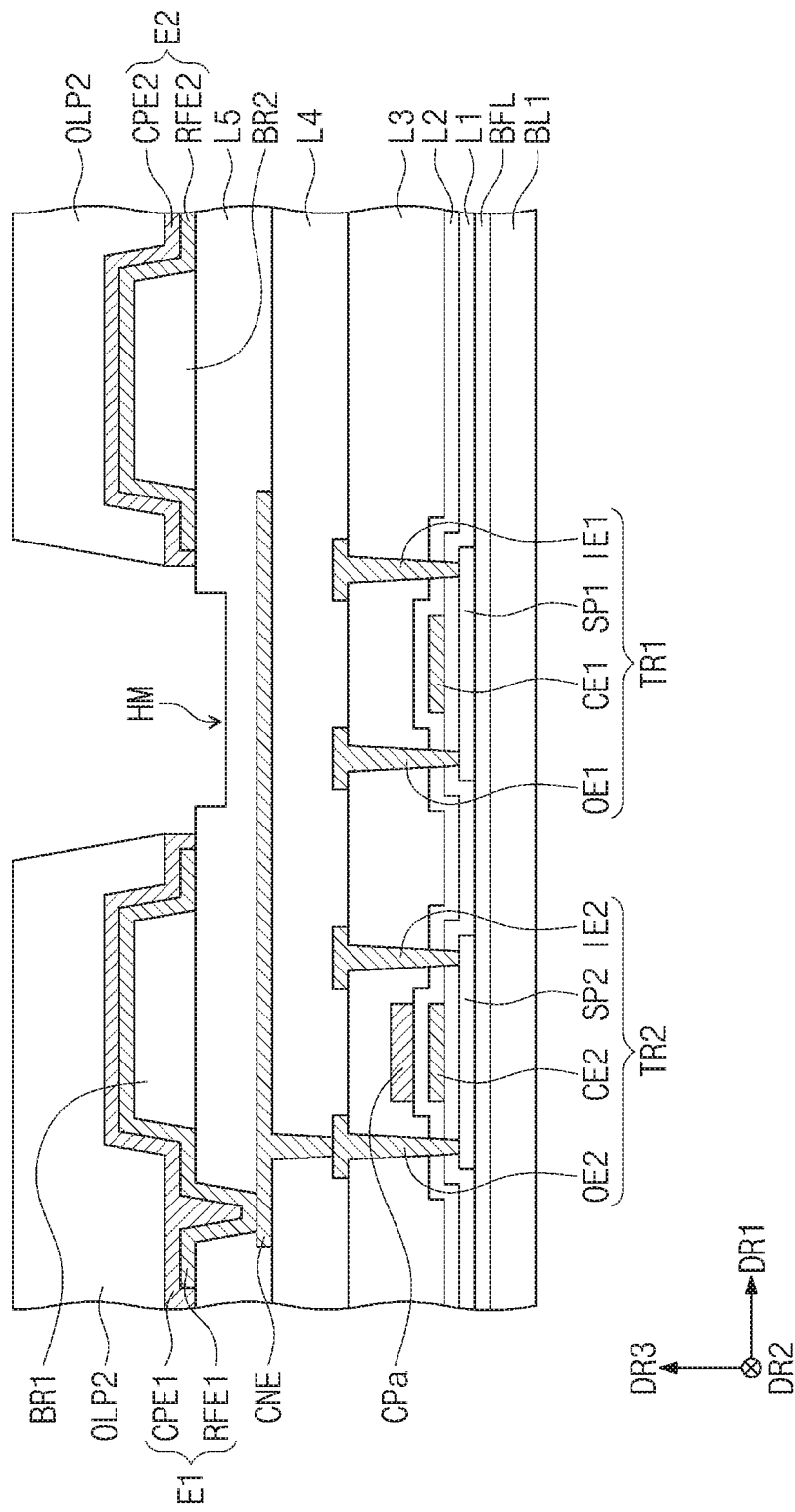

Referring to FIG. 7H, before removal of the second photoresist pattern OPL2, a portion in a thickness direction (e.g., the third direction DR3) of the fifth insulating layer L5 that is exposed between the first and second capping electrodes CPE1 and CPE2 may be removed. A dry etching process may be performed to remove the exposed portion of the fifth insulating layer L5 and form the recess HM in the fifth insulating layer L5.

The recess HM may be formed in an area between the first electrode E1 and the second electrode E2 in a plan view. Thus, a residue of a conductive material that may remain between the first and second electrodes E1 and E2 may be removed when the recess HM is formed. As a result, a short between the first and second electrodes E1 and E2 may be prevented.

According to the embodiments of the inventive concepts, the recess HM may be formed in the fifth insulating layer L5 by using the second photoresist pattern OLP2 that is used to form the first and second capping electrodes CPE1 and CPE2. As a result, a cost for forming an additional photoresist pattern to form the recess HM in may not be incurred.

In an embodiment of the inventive concepts, the first and second capping electrodes CPE1 and CPE2 may be formed using a wet etching process after the formation of the second photoresist pattern OLP2, and then, the recess HM may be formed in the fifth insulating layer L5 by a dry etching process. In another embodiment of the inventive concepts, the first and second capping electrodes CPE1 and CPE2 and the recess HM of the fifth insulating layer L5 may be formed using a dry etching process after the formation of the second photoresist pattern OLP2. In this case, the etching process may be simplified. When the first and second capping electrodes CPE1 and CPE2 and the recess HM of the fifth insulating layer L5 are formed using the dry etching process, a mixed gas of chlorine ($Cl_2$) and boron chloride ($BCl_3$) may be used.

Figure 7I:
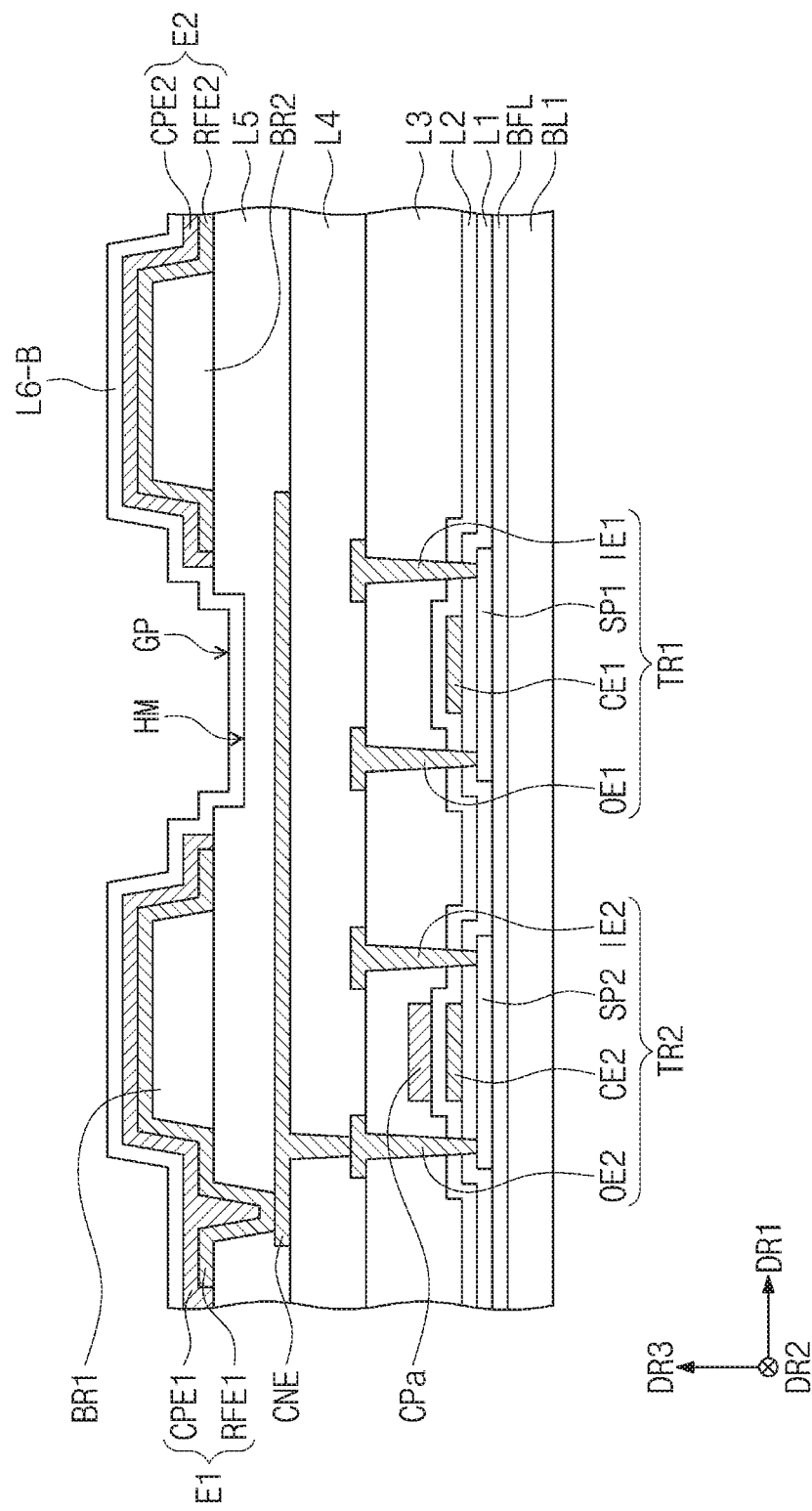

Referring to FIG. 7I, a sixth insulating layer L6-B may be formed to cover the first electrode E1, the second electrode E2, and the recess HM. The sixth insulating layer L6-B may include an inorganic material. For example, the sixth insulating layer L6-B may include silicon nitride.

The concave portion GP may be defined in an area of the sixth insulating layer L6-B that corresponds to the recess HM, e.g., a portion that covers the recess HM. The concave portion GP may be provided to fill the recess HM, thus the concave portion GP after being formed may have a shape conforming to the shape of the recess HM.

Figure 7J:
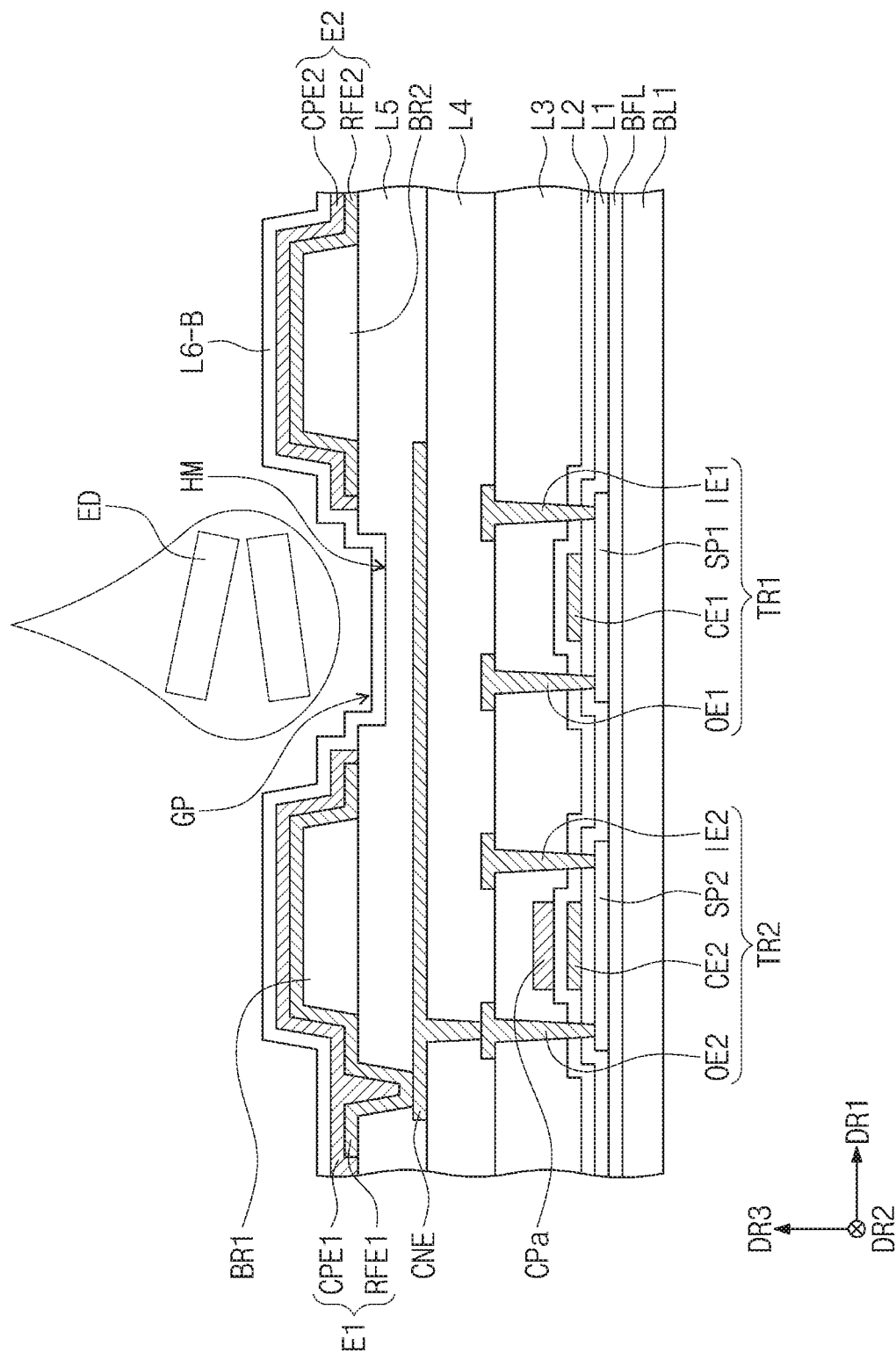
Figure 7K:
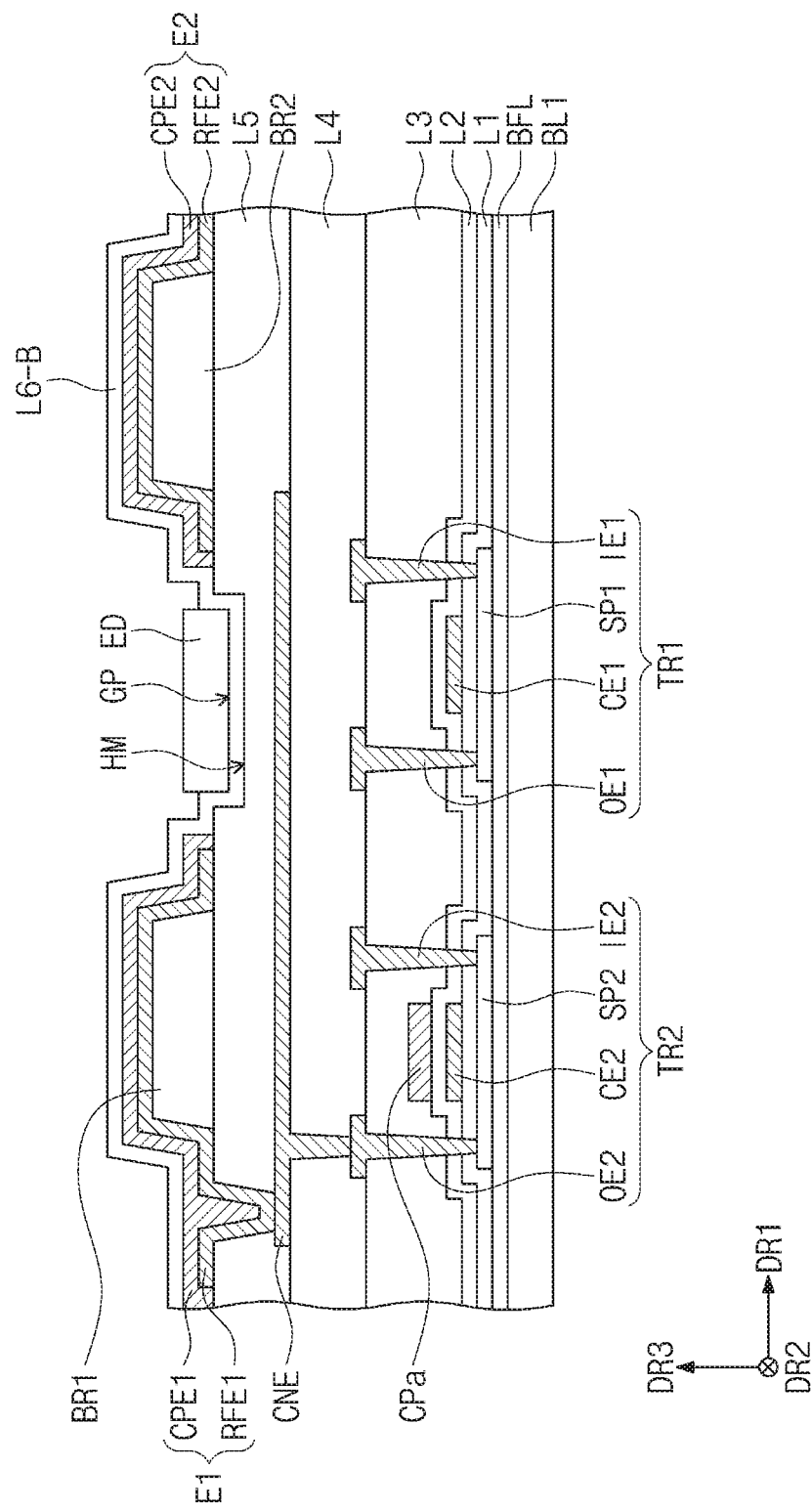

Referring to FIGS. 7J and 7K, a solution including the light emitting element ED and solvent may be provided onto the recess HM and the concave portion GP. The solvent may be a material that can evaporate at a room temperature or by heat. The solution may be ink or paste including the light emitting element ED. Electric power may be applied to the first and second electrodes E1 and E2 to form an electric field between the first and second electrodes E1 and E2. Bipolarity may be induced in the light emitting element ED by the electric field, and the light emitting element ED may be aligned between the first electrode E1 and the second electrode E2 by the dielectrophoretic force. The solvent may be evaporated after the light emitting element ED is aligned. If a short occurs between the first and second electrodes E1 and E2, the electric field may not be properly formed. If the electric field is not properly formed, the light emitting element ED may not be properly aligned. However, according to the embodiments of the inventive concepts, since the recess HM is provided between the first and second electrodes E1 and E2, and a residue of the conductive material that may remain between the first and second electrodes E1 and E2 after forming the first and second electrodes E1 and E2 may be removed while forming the recess HM, an electrical short between the first and second electrodes E1 and E2 that may be caused by the residue of the conductive material can be prevented. Thus, alignment reliability of the light emitting element ED may be improved.

According to the embodiments of the inventive concepts, the light emitting element ED may be easily seated between the first and second electrodes E1 and E2 in an area corresponding to the recess HM and the concave portion GP. Thus, an alignment degree of the light emitting element ED may be improved.

Figure 7L:
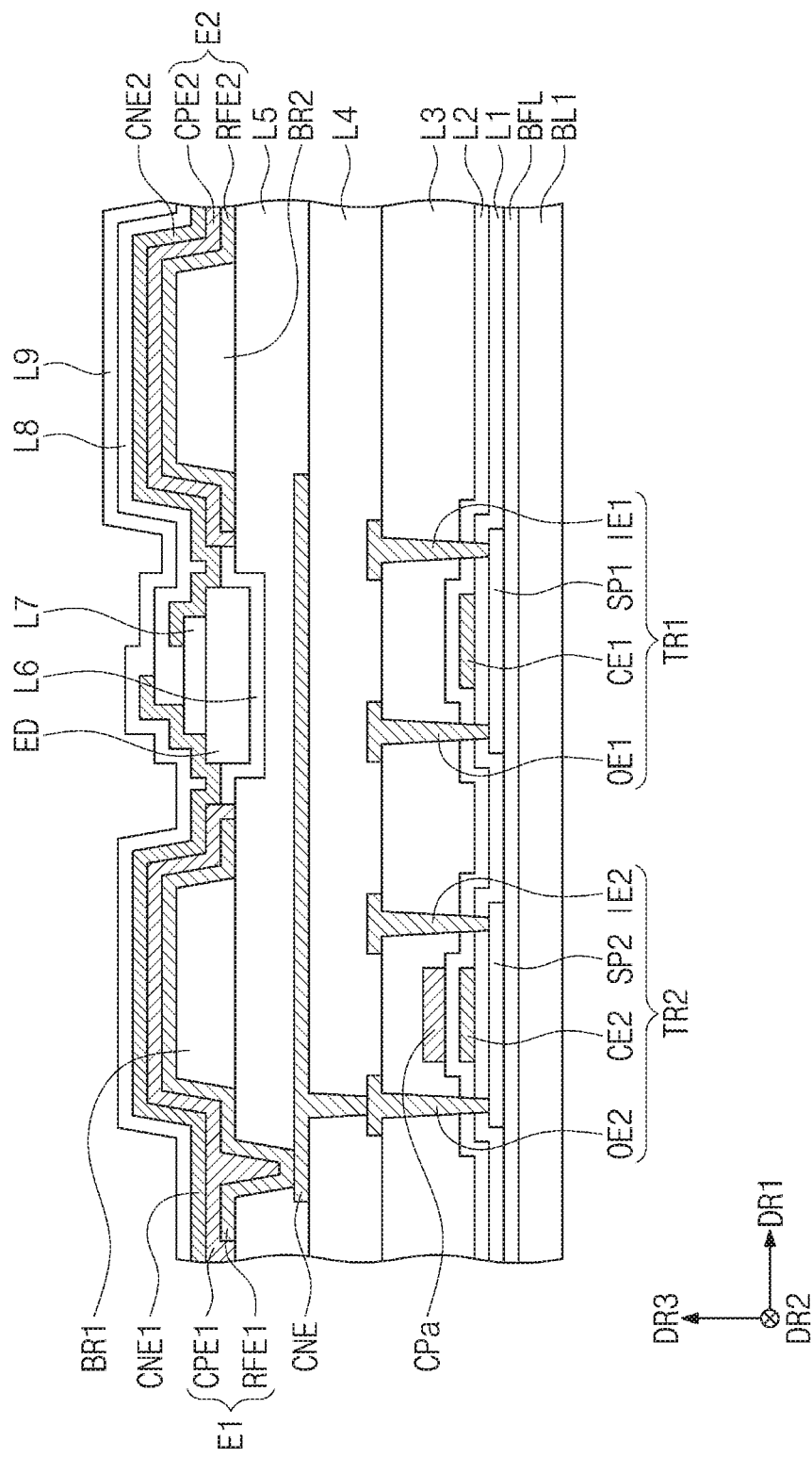

Referring to FIG. 7L, the insulating pattern L7 may be formed on the light emitting element ED, and the sixth insulating layer L6-B may be patterned to form the sixth insulating layer L6. Thereafter, the second connection electrode CNE2, the eighth insulating layer L8, the first connection electrode CNE1, and the ninth insulating layer L9 may be sequentially formed.

Figure 8A:
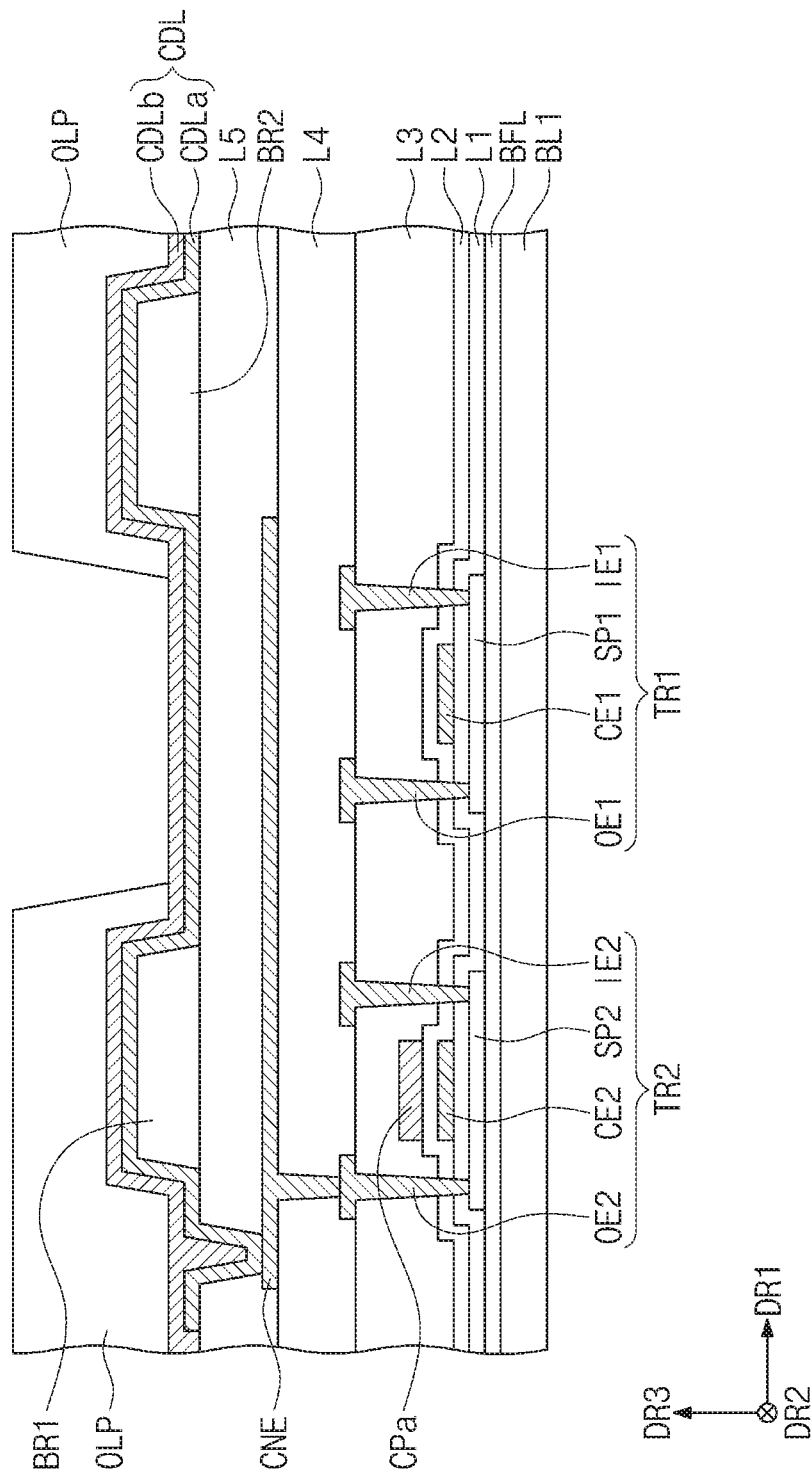
FIGS. 8A to 8C are cross-sectional views illustrating some of processes of manufacturing a display device, according to another embodiment of the inventive concepts.
Figure 8B:
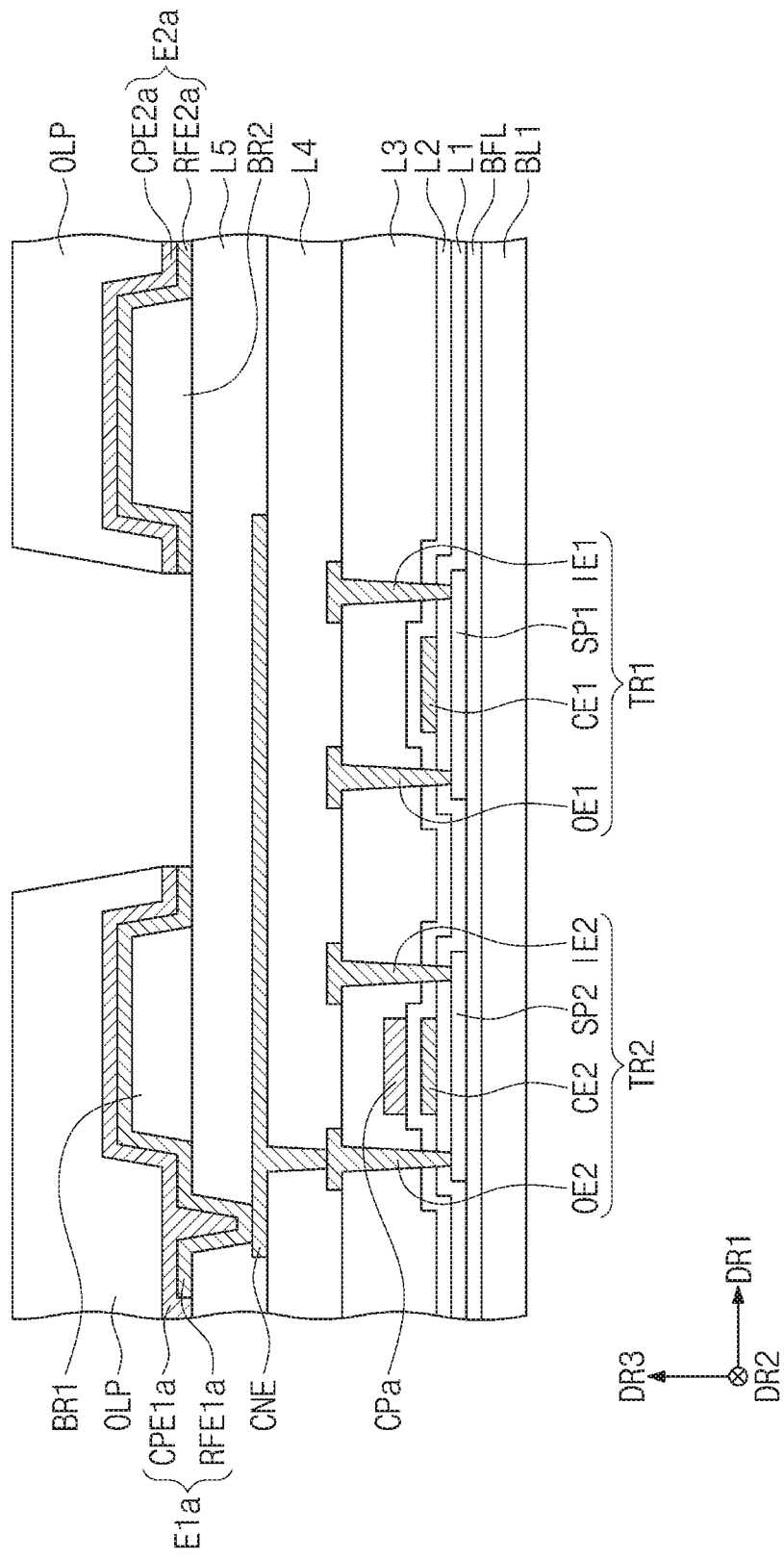
Figure 8C:
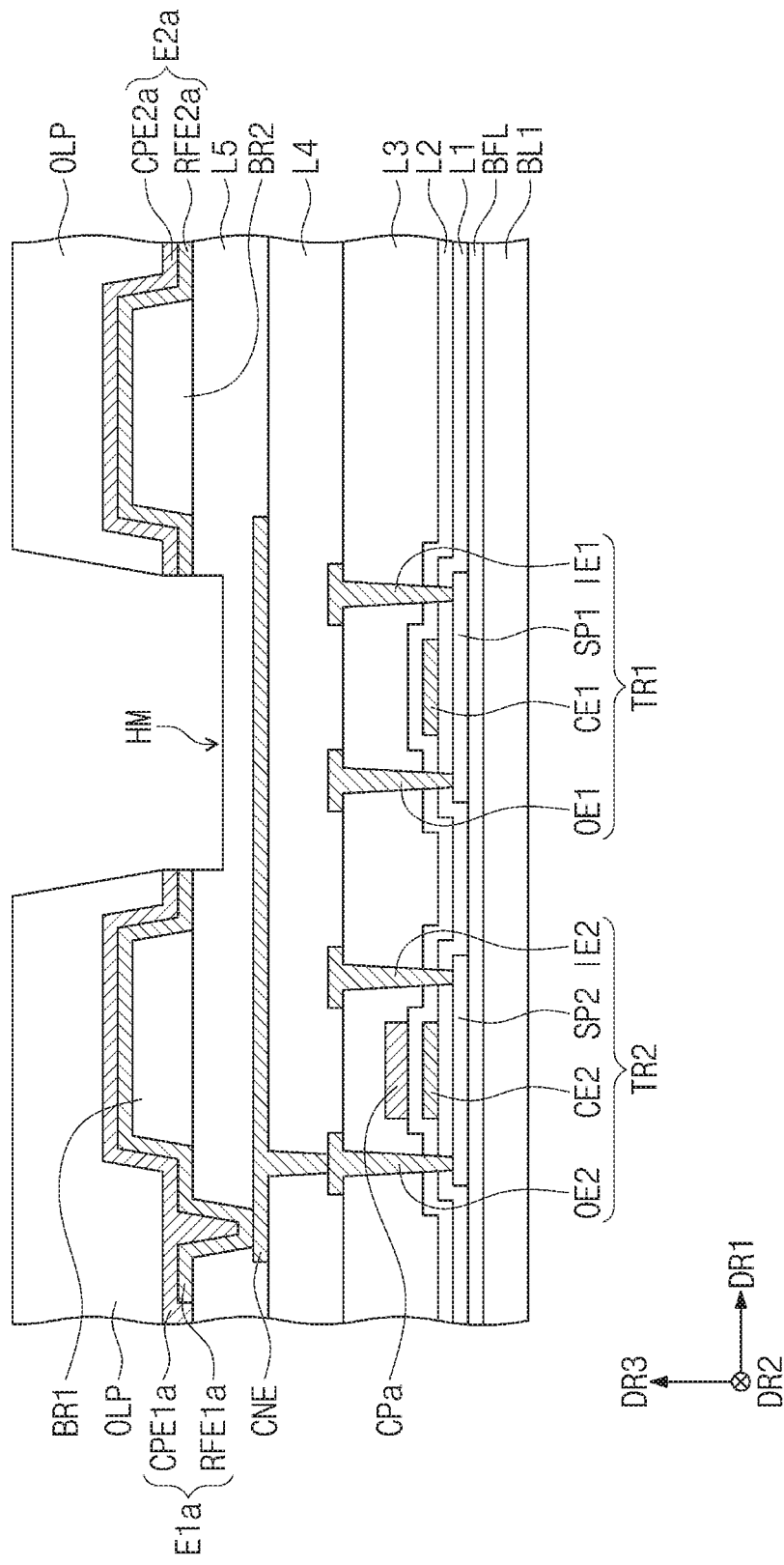

FIGS. 8A to 8C are cross-sectional views illustrating some of processes of manufacturing a display device, according to another embodiment of the inventive concepts.

Referring to FIG. 8A, a conductive layer CDL covering the first and second partitions BR1 and BR2 may be formed on the fifth insulating layer L5. The conductive layer CDL may include a first conductive layer CDLa and a second conductive layer CDLb.

The first conductive layer CDLa may include a reflective material. For example, the first conductive layer CDLa may have a structure in which a first indium tin oxide (ITO) layer, a silver (Ag) layer, and a second indium tin oxide (ITO) layer are sequentially stacked. For example, the second conductive layer CDLb may include at least one of indium zinc oxide (IZO), indium tin oxide (ITO), indium gallium oxide (IGO), and indium zinc gallium oxide (IZGO), or any mixture/compound thereof.

A photoresist pattern OLP may be formed on the conductive layer CDL. A positive photoresist layer or a negative photoresist layer may be formed and then may be patterned to form the photoresist pattern OLP. For example, a patterning process to form the photoresist pattern OLP may include an exposure process and a development process.

A process described with reference to FIG. 8B may be a modified example of the processes described with reference to FIGS. 7B to 7G. Referring to FIG. 8B, a portion of the conductive layer CDL exposed by the photoresist pattern OLP may be removed. A first electrode E1a and a second electrode E2a may be formed using a wet etching process after the formation of the photoresist pattern OLP. The first electrode E1a may include a first reflective electrode RFE1a and a first capping electrode CPE1a, and the second electrode E2a may include a second reflective electrode RFE2a and a second capping electrode CPE2a. In other words, the first reflective electrode RFE1a, the first capping electrode CPE1a, the second reflective electrode RFE2a, and the second capping electrode CPE2a may be formed by a single etching process.

Referring to FIG. 8C, after the formation of the first and second electrodes E1a and E2a, a dry etching process may be performed using the photoresist pattern OLP. An exposed portion of the fifth insulating layer L5 by the photoresist pattern OLP may be etched by the dry etching process to form the recess HM. A residue of the conductive material that may remain between the first and second electrodes E1a and E2a after forming the first and second electrodes E1 and E2 may be removed by the dry etching process. The light emitting element ED (see FIG. 3) may be disposed and seated in the recess HM, and thus the light emitting element ED may be easily aligned between the first and second electrodes E1 and E2.

According to the embodiments of the inventive concepts, the recess may be provided between the first and second electrodes, and the light emitting element may be disposed in an area corresponding to the recess. A residue of the conductive material that may remain between the first and second electrodes after forming the first and second electrodes may be removed by an etching process for forming the recess. Thus, a short between the first and second electrodes may be prevented. In addition, since the light emitting element is disposed in the area corresponding to the recess, and the short between the first and second electrodes is prevented, the light emitting element may be easily aligned. Thus, reliability of the display device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative of the inventive concepts. Thus, the scopes of the inventive concepts are to be determined by the broadest permissible interpretation of the present disclosure including the following claims and their equivalents, and shall not be restricted or limited by the foregoing description.

What is claimed is:

1. A display device comprising:
   a pixel circuit;
   a first insulating layer covering the pixel circuit;
   a first electrode disposed on the first insulating layer;
   a second electrode disposed on the first insulating layer and spaced apart from the first electrode in a first direction; and
   a light emitting element electrically connected to the first electrode and the second electrode and disposed between the first electrode and the second electrode,
   wherein a recess is provided in a first region of the first insulating layer between the first electrode and the second electrode when viewed in a plan view,
   wherein a width of the recess in the first direction is greater than a length of the light emitting element in the first direction, and
   wherein the first electrode and the second electrode do not overlap the recess when viewed in the plan view.

2. The display device of claim 1, wherein the light emitting element is disposed and seated in the recess.

3. The display device of claim 1, further comprising:
   a second insulating layer covering the recess and disposed between the light emitting element and the recess.

4. The display device of claim 3, wherein a concave portion is defined in an area of the second insulating layer that covers the recess, and the light emitting element is disposed and seated in the concave portion.

5. The display device of claim 1, wherein the first insulating layer includes an organic material.

6. The display device of claim 1, further comprising:
   a first partition disposed between the first electrode and the first insulating layer; and
   a second partition disposed between the second electrode and the first insulating layer,
   wherein the light emitting element is disposed between the first partition and the second partition in the plan view.

7. The display device of claim 1, wherein a second region of the first insulating layer except the first region having the recess provides a flat top surface, and wherein at least a portion of the light emitting element is disposed under a plane including the flat top surface when viewed in a cross-sectional view.

8. The display device of claim 1, wherein a distance between the first electrode and the second electrode in the first direction is equal to or greater than the width of the recess in the first direction.

9. The display device of claim 1, wherein the first electrode is electrically connected to the pixel circuit and comprises: a first reflective electrode including a reflective material; and a first capping electrode covering the first reflective electrode, and wherein the second electrode is configured to receive a power source voltage and comprises: a second reflective electrode including the reflective material; and a second capping electrode covering the second reflective electrode.

10. A display device comprising:

a pixel circuit;

an insulating layer that covers the pixel circuit, has a recess recessed in a thickness direction in a first region of the insulating layer, and provides a flat top surface in a second region of the insulating layer except the first region having the recess;

a first electrode electrically connected to the pixel circuit;

a second electrode disposed on a same layer as the first electrode and spaced apart from the first electrode in a first direction with the recess interposed between the first electrode and the second electrode; and a light emitting element that overlaps the recess in a plan view and is electrically connected to the first electrode and the second electrode, wherein the light emitting element overlaps the insulating layer in the first direction, and the first electrode and the second electrode do not overlap the recess when viewed in the plan view.

11. The display device of claim 10, wherein a width of the recess in the first direction is greater than a length of the light emitting element in the first direction.

* * * * *